US012588323B2

(12) United States Patent
Miyake et al.

(10) Patent No.: US 12,588,323 B2
(45) Date of Patent: Mar. 24, 2026

(54) NITRIDE SEMICONDUCTOR SUBSTRATE, SEMICONDUCTOR ELEMENT, AND METHOD FOR MANUFACTURING NITRIDE SEMICONDUCTOR SUBSTRATE

(71) Applicant: MIE UNIVERSITY, Mie (JP)

(72) Inventors: Hideto Miyake, Mie (JP); Ding Wang, Mie (JP); Kenjiro Uesugi, Mie (JP)

(73) Assignee: MIE UNIVERSITY, Mie (JP)

( * ) Notice: Subject to any disclaimer, the term of this patent is extended or adjusted under 35 U.S.C. 154(b) by 722 days.

(21) Appl. No.: 17/802,342

(22) PCT Filed: Feb. 26, 2021

(86) PCT No.: PCT/JP2021/007422
§ 371 (c)(1),
(2) Date: Aug. 25, 2022

(87) PCT Pub. No.: WO2021/172531
PCT Pub. Date: Sep. 2, 2021

(65) Prior Publication Data
US 2023/0100683 A1 Mar. 30, 2023

(30) Foreign Application Priority Data
Feb. 27, 2020 (JP) ................................. 2020-032268

(51) Int. Cl.
*H10H 20/825* (2025.01)
*H10H 20/01* (2025.01)
(52) U.S. Cl.
CPC .......... *H10H 20/825* (2025.01); *H10H 20/01* (2025.01); *H10H 20/01335* (2025.01)

(58) Field of Classification Search
CPC ............ H10H 20/825; H10H 20/01335; C23C 14/0641; C30B 29/40; C30B 29/38; H01L 21/0254; H01L 21/02378; H01L 21/0242; H01L 21/02433; H01L 21/02458; H01L 21/02502; H01L 21/0237; H01L 21/02587
See application file for complete search history.

(56) References Cited

U.S. PATENT DOCUMENTS

2010/0219395 A1 9/2010 Hirayama et al.
2014/0294713 A1 10/2014 Saito et al.
(Continued)

FOREIGN PATENT DOCUMENTS

JP 2005-317560 11/2005
JP 2007-35824 2/2007
(Continued)

OTHER PUBLICATIONS

Extended European Search Report issued Mar. 20, 2024 in corresponding European Patent Application No. 21761788.5.
(Continued)

*Primary Examiner* — Julia Slutsker
(74) *Attorney, Agent, or Firm* — WENDEROTH, LIND & PONACK, L.L.P.

(57) ABSTRACT

A nitride semiconductor substrate (11, 21) includes: a substrate (2); and an AlN-containing film (100, 200) provided above the substrate (2). A thickness of the AlN-containing film (100, 200) is at most 10000 nm, and a threading dislocation density of the AlN-containing film (100, 200) is at most $2 \times 10^8$ cm$^{-2}$.

8 Claims, 21 Drawing Sheets

(56) References Cited

U.S. PATENT DOCUMENTS

| | | | |
|---|---|---|---|
| 2014/0315394 A1 | 10/2014 | Jouanneau et al. | |
| 2018/0158680 A1 | 6/2018 | Fujikura et al. | |
| 2018/0204722 A1 | 7/2018 | Miyake | |
| 2018/0274088 A1 | 9/2018 | Miyake | |
| 2019/0280156 A1 | 9/2019 | Fujiwara et al. | |
| 2021/0184004 A1* | 6/2021 | Oishi | H01L 21/0254 |
| 2022/0106706 A1 | 4/2022 | Yoshida | |

FOREIGN PATENT DOCUMENTS

| | | |
|---|---|---|
| JP | 2008-60519 | 3/2008 |
| JP | 2010-205767 | 9/2010 |
| JP | 2014-535171 | 12/2014 |
| JP | 2015-10023 | 1/2015 |
| JP | 2017-55116 | 3/2017 |
| JP | 2018-93112 | 6/2018 |
| JP | 2019-29536 | 2/2019 |
| JP | 6646769 | 2/2020 |
| JP | 2020-37507 | 3/2020 |
| WO | 2018/097102 | 5/2018 |

OTHER PUBLICATIONS

Kanako Shojiki et al., "Impact of face-to-face annealed sputtered AlN on the optical properties of AlGaN multiple quantum wells", AIP Advances, American Institute of Physics, vol. 9, No. 12, Dec. 31, 2019, pp. 125342-1-125342-9.

Ding Wang et al., "Low dislocation density AlN on sapphire prepared by double sputtering and annealing", Applied Physics Express, vol. 13, No. 9, Aug. 18, 2020, pp. 095501-1-095501-5.

International Search Report (ISR) issued May 11, 2021 in International (PCT) Application No. PCT/JP2021/007422.

Kazuhito Ban et al., "Internal Quantum Efficiency of Whole-Composition-Range AlGaN Multiquantum Wells", Applied Physics Express, 4, 052101, Apr. 18, 2011.

Masataka Imura et al., "High-Temperature Metal-Organic Vapor Phase Epitaxial Growth of AlN on Sapphire by Multi Transition Growth Mode Method Varying V/III Ratio", Japanese Journal of Applied Physics, vol. 45, No. 11, pp. 8639-8643, Nov. 8, 2006.

Y. Hayashi et al., "Fabrication of Polarity Inverted AlN structure toward NIR Wavelength Conversion", The 80th JSAP Autumn Meeting, Sep. 4, 2019.

Kenjiro Uesugi et al., "Reduction of threading dislocation density and suppression of cracking in sputter-deposited AlN templates annealed at high temperatures", Applied Physics Express, 12, 065501, pp. 1-4, May 8, 2019.

* cited by examiner

FIG. 8

| Sample substrate (Substrate number) | First AlN film 10 | | | Second AlN film 20 | | | Third AlN film 30 | | | Thickness (nm) | XRC-FWHM (arcsec) | | Surface state |
|---|---|---|---|---|---|---|---|---|---|---|---|---|---|
| | Thickness (nm) | Annealing temp. (°C) | Annealing time (h) | Thickness (nm) | Annealing temp. (°C) | Annealing time (h) | Thickness (nm) | Annealing temp. (°C) | Annealing time (h) | | AlN (0002) | AlN (10-12) | |
| A1 | 480 | 1725 | 3 | - | - | - | - | - | - | 480 | 12 | 121 | - |
| A2 | 480 | 1725 | 3 | 0 | 1725 | 3 | - | - | - | 480 | 12 | 115 | - |
| A3 | 480 | 1725 | 3 | 0 | 1725 | 3 | 0 | 1725 | 3 | 480 | 16 | 117 | rough |
| B1 | 600 | 1725 | 3 | - | - | - | - | - | - | 600 | 15 | 118 | - |
| B2 | 600 | 1725 | 3 | 0 | 1725 | 3 | - | - | - | 600 | 13 | 107 | - |
| B3 | 600 | 1725 | 3 | 0 | 1725 | 3 | 0 | 1725 | 3 | 600 | 18 | 91 | pits |
| C1 | 900 | 1725 | 3 | - | - | - | - | - | - | 900 | 16 | 118 | - |
| C2 | 900 | 1725 | 3 | 0 | 1725 | 3 | - | - | - | 900 | 15 | 86 | pits |
| D1 | 1200 | 1725 | 6 | - | - | - | - | - | - | 1200 | 38 | 101 | pits |
| D2 | 1200 | 1725 | 3 | 0 | 1725 | 9 | - | - | - | 1200 | 28 | 102 | - |
| F1 | 460 | 1300 | 3 | 460 | 1725 | 3 | - | - | - | 920 | - | 184 | - |
| F2 | 460 | 1500 | 3 | 460 | 1725 | 3 | - | - | - | 920 | - | 115 | - |
| F3 | 460 | 1600 | 3 | 460 | 1725 | 3 | - | - | - | 920 | - | 115 | - |
| F4 | 460 | 1700 | 3 | 460 | 1725 | 3 | - | - | - | 920 | - | 105 | - |
| G1 | 480 | 1725 | 3 | 480 | 1725 | 3 | - | - | - | 960 | 20 | 106 | flat |
| G2 | 480 | 1725 | 3 | 480 | 1725 | 3 | 480 | 1725 | 3 | 1440 | 20 | 91 | flat |
| H1 | 600 | 1725 | 3 | 600 | 1725 | 3 | - | - | - | 1200 | 26 | 90 | flat |
| H2 | 600 | 1725 | 3 | 600 | 1725 | 9 | - | - | - | 1200 | 18 | 78 | - |
| H3 | 600 | 1725 | 3 | 600 | 1725 | 3 | 0 | 1725 | 6 | 1200 | 97 | 84 | - |
| H4 | 600 | 1725 | 3 | 600 | 1725 | 3 | 600 | 1725 | 6 | 1800 | 18 | 91 | - |

Threading dislocation
density: 6.9×10⁷ cm⁻²

(a)

Threading dislocation
density: 5.9×10⁷ cm⁻²

(b)

Threading dislocation
density: 4.9×10⁷ cm⁻²

| Sample substrate (Substrate number) | First AlN film 10 | | | Second AlN film 20 | | | | Third AlN film 30 | | | | Total thickness (nm) | XRC-FWHM (arcsec) | | Threading dislocation density (cm−2) |
|---|---|---|---|---|---|---|---|---|---|---|---|---|---|---|---|
| | Thickness (nm) | Annealing temp. (°C) | Annealing time (h) | Thickness (nm) | Annealing temp. (°C) | Annealing time (h) | | Thickness (nm) | Annealing temp. (°C) | Annealing time (h) | | | AlN (0002) | AlN (10-12) | |
| D2 | 1200 | 1725 | 3 | 0 | 1725 | 9 | | — | — | — | | 1200 | 28 | 102 | $6.9 \times 10^7$ |
| H2 | 600 | 1725 | 3 | 600 | 1725 | 9 | | — | — | — | | 1200 | 18 | 78 | $5.9 \times 10^7$ |
| H3 | 600 | 1725 | 3 | 600 | 1725 | 3 | | 0 | 1725 | 6 | | 1200 | 97 | 84 | $4.9 \times 10^7$ |

| Sample substrate (Substrate number) | First AlN 10 | | XRC-FWHM (arcsec) | |
|---|---|---|---|---|
| | Thickness (nm) | $T_{mid}$ (°C) | AlN (0002) | AlN (10-12) |
| 51 | 793 | 1300 | 12 | 92 |
| 52 | 793 | 1000 | 18 | 88 |
| 53 | 793 | 700 | 21 | 90 |
| 54 | 793 | 400 | 14 | 84 |
| 55 | 784 | 150 | 14 | 86 |

FIG. 13

| Sample substrate (Substrate number) | First AlN 10 | | XRC-FWHM (arcsec) | |
|---|---|---|---|---|
| | Thickness (nm) | Total time (h) @1700°C | AlN (0002) | AlN (10-12) |
| 56 | 793 | 12 | 12 | 80 |
| 57 | 784 | 9 | 14 | 83 |

FIG. 15

| Sample substrate (Substrate number) | First AlN 10 | | | XRC-FWHM (arcsec) | |
|---|---|---|---|---|---|
| | Thickness (nm) | N₂ Flow (sccm) During SP | Total time (h) @1700°C | AlN (0002) | AlN (10-12) |
| 58 | 791 | 24 | 9 | 12 | 83 |
| 59 | 778 | 19 → 28 | 9 | 11 | 78 |
| 60 | 798 | 19 → 32 | 9 | 14 | 76 |

(b)

Al Secondary Intensity (cps)

Substrate 2

First AlN film 10

O: Oxygen

Al: Aluminum

C: Carbon

Si: Silicon

H: Hydrogen

Depth (nm)

H,C,O,Si Concentration (Atoms/cm³)

(a)

Al Secondary Intensity (cps)

Substrate 2

First AlN film 10

O: Oxygen

Al: Aluminum

H: Hydrogen

C: Carbon

Si: Silicon

Depth (nm)

H,C,O,Si Concentration (Atoms/cm³)

NITRIDE SEMICONDUCTOR SUBSTRATE, SEMICONDUCTOR ELEMENT, AND METHOD FOR MANUFACTURING NITRIDE SEMICONDUCTOR SUBSTRATE

TECHNICAL FIELD

The present invention relates to a nitride semiconductor substrate, a semiconductor element, and a method for manufacturing a nitride semiconductor substrate.

BACKGROUND ART

Group III nitride semiconductors such as aluminum nitride (AlN), aluminum gallium nitride (AlGaN), and aluminum gallium indium nitride (AlGaInN) semiconductors have been gaining attention as materials for optical semiconductor devices such as ultraviolet light emitting elements.

For example, AlN has a very wide band gap among such semiconductor materials, and can efficiently take out ultraviolet light to the outside. Thus, AlN is expected to serve as a highly efficient light emitting element substrate. However, a bulk AlN monocrystal substrate is expensive and difficult to be produced to have a large area, so that the material of a substrate for an ultraviolet light emitting element has many cost-involved problems.

In view of such circumstances, there are expectations for a nitride semiconductor substrate in which a high-quality AlN thin film is produced on an inexpensive sapphire substrate, for example.

However, there is a large lattice mismatch between AlN and sapphire, and thus the AlN thin film grown on the sapphire substrate includes many threading dislocations. Accordingly, it is difficult to obtain an AlN thin film with a flat surface, which is deposited on the sapphire substrate, and also there is a problem that the AlN thin film has many crystal defects.

There is a method for obtaining a nitride semiconductor substrate in which a high-quality AlN thin film having a low defect density of AlN crystals is deposited, which is a technology disclosed in Patent Literature (PTL) 1, for example.

CITATION LIST

Patent Literature

[PTL 1] Japanese Unexamined Patent Application Publication No. 2017-055116

Non Patent Literature

[NPL 1] The 80th JSAP Autumn Meeting "Fabrication of +c AlN/-c AlN Structure toward NIR Wavelength Conversion" Yusuke Hayashi and others

SUMMARY OF INVENTION

Technical Problem

PTL 1 discloses a method for manufacturing a nitride semiconductor substrate by annealing a substrate on which a group III nitride semiconductor is formed in a gas-tight state in which a principal surface of the group III nitride semiconductor is covered with a cover member for inhibiting components of the group III nitride semiconductor from dissociating from the principal surface thereof.

However, PTL 1 discloses that the full width at half maximum of the X-ray diffraction rocking curve of the (10-12) plane of the nitride semiconductor substrate manufactured using the above manufacturing method is 300 arcsec, and thus further crystallization is required.

The present invention is to address the above problems, and an object thereof is to provide a high-quality nitride semiconductor substrate and others.

Solution to Problem

In order to achieve the above object, a nitride semiconductor substrate according to an aspect of the present invention includes: a substrate; and an AlN-containing film provided above the substrate. A thickness of the AlN-containing film is at most 10000 nm, and a threading dislocation density of the AlN-containing film is at most $2\times10^8$ cm$^2$.

Furthermore, a nitride semiconductor substrate according to an aspect of the present invention includes: a substrate; and an AlN-containing film provided above the substrate. A thickness of the AlN-containing film is in a range from 300 nm to 10000 nm, an oxygen concentration of the AlN-containing film is in a range from $10^{18}$ cm$^{-3}$ to $10^{21}$ cm$^{-3}$, and a hydrogen concentration of the AlN-containing film is in a range from $10^{16}$ cm$^{-3}$ to $2\times10^{17}$ cm$^{-3}$.

A semiconductor element according to an aspect of the present invention includes the above nitride semiconductor substrate.

A method for manufacturing a nitride semiconductor substrate according to an aspect of the present invention includes: a preparation process of preparing a substrate; a deposition process of depositing an AlN film having a thickness in a range from 100 nm to 900 nm, above the substrate; and an annealing process of annealing the AlN film deposited in the deposition process at at least 1500° C. At least one of the deposition process or the annealing process is performed multiple times, and a threading dislocation density of the AlN film deposited is at most $2\times10^8$ cm$^{-2}$.

Advantageous Effects of Invention

According to the present invention, a high-quality nitride semiconductor substrate and others can be produced.

BRIEF DESCRIPTION OF DRAWINGS

FIG. 8 is an example drawing illustrating a table showing crystallinity of the nitride semiconductor substrates according to the embodiment.

FIG. 9B is another example drawing illustrating a table showing crystallinity of the nitride semiconductor substrates according to the embodiment.

FIG. 9C illustrates cross-sectional TEM images of the nitride semiconductor substrate according to the embodiment.

FIG. 11 is another example drawing illustrating a table showing crystallinity of the nitride semiconductor substrate according to the embodiment.

FIG. 13 is another example drawing illustrating a table showing crystallinity of the nitride semiconductor substrate according to the embodiment.

FIG. 15 is another example drawing illustrating a table showing crystallinity of the nitride semiconductor substrates according to the embodiment.

DESCRIPTION OF EMBODIMENTS

The following describes in detail embodiments of the present invention, with reference to the drawings.

Note that the embodiments described below each show a general or specific example. The numerical values, shapes, materials, elements, the arrangement and connection of the elements, steps, and the processing order of the steps, for instance, described in the following embodiments are examples, and thus are not intended to limit the present invention.

Note that the drawings are schematic diagrams, and do not necessarily provide strictly accurate illustration. Throughout the drawings, the same numeral is given to substantially the same element, and redundant description is omitted or simplified.

In the embodiments below, the terms "above" and "below" do not indicate upward (vertically upward) and downward (vertically downward) in the absolute recognition of space. Furthermore, the terms "above" and "below" are used not only when two elements are spaced apart from each other and another element is present therebetween, but also when two elements are in close contact with each other and touching each other.

In the description below, aluminum may be represented by Al, gallium may be represented by Ga, indium may be represented by In, nitrogen may be represented by N, aluminum nitride may be represented by AlN, aluminum gallium nitride may be represented by AlGaN, aluminum gallium indium nitride may be represented by AlGaInN, boron aluminum nitride may be represented by BAlN, boron aluminum gallium nitride may be represented by BAlGaN, and scandium aluminum magnesium oxide may be represented by ScAlMgO$_4$.

Embodiment

[Configuration of Nitride Semiconductor Substrate]

Figure 2:
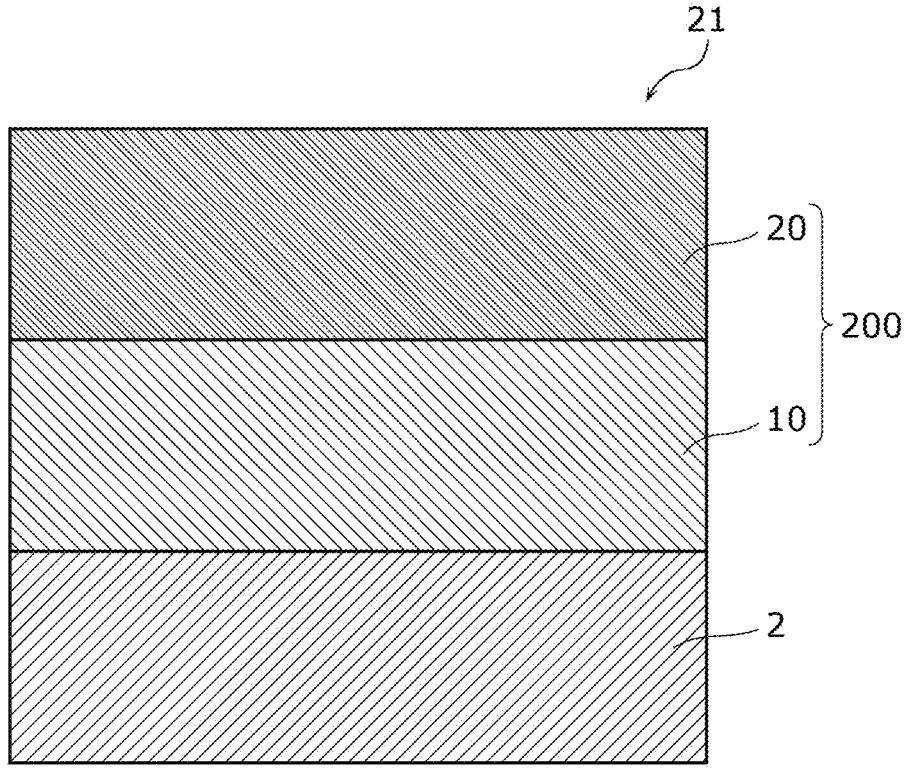
FIG. 2 illustrates an example of a configuration of a nitride semiconductor substrate according to a second example of the embodiment.
Figure 3:
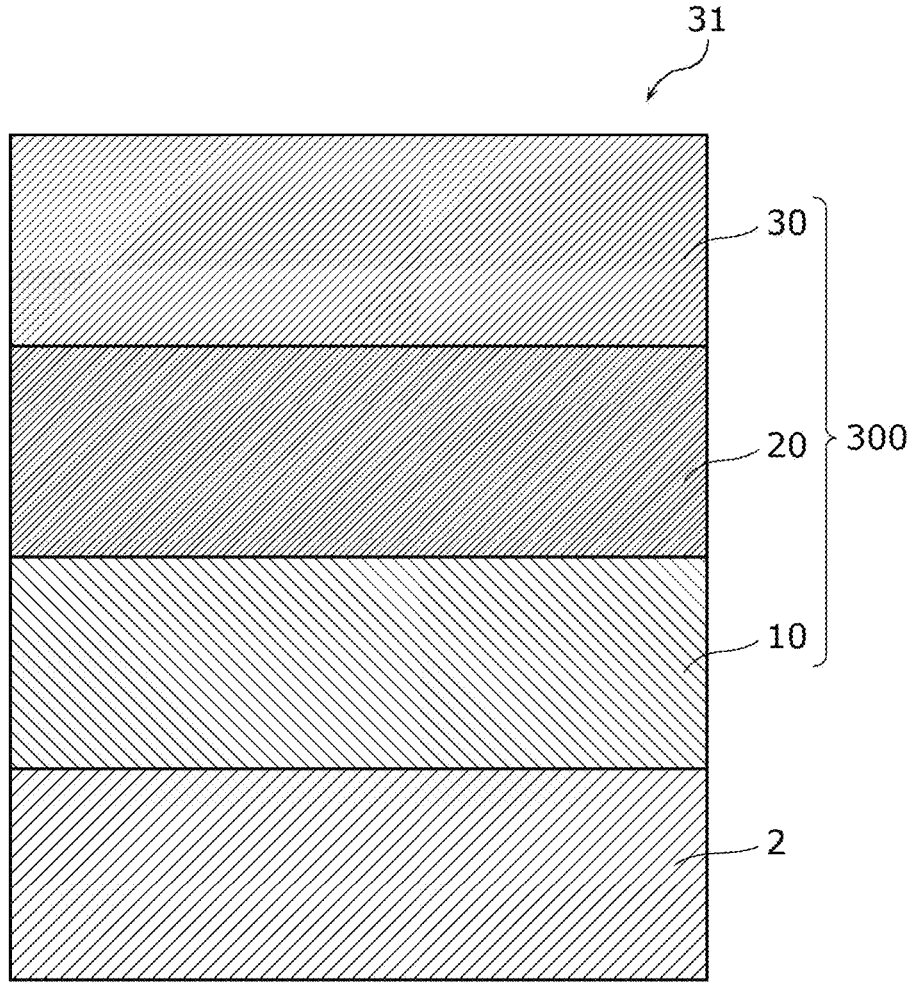
FIG. 3 illustrates an example of a configuration of a nitride semiconductor substrate according to a third example of the embodiment.

First, examples of configurations of nitride semiconductor substrate 11 according to a first example of the present embodiment, nitride semiconductor substrate 21 according to a second example thereof, and nitride semiconductor substrate 31 according to a third example thereof are to be described with reference to FIGS. 1, 2, and 3.

Figure 1:
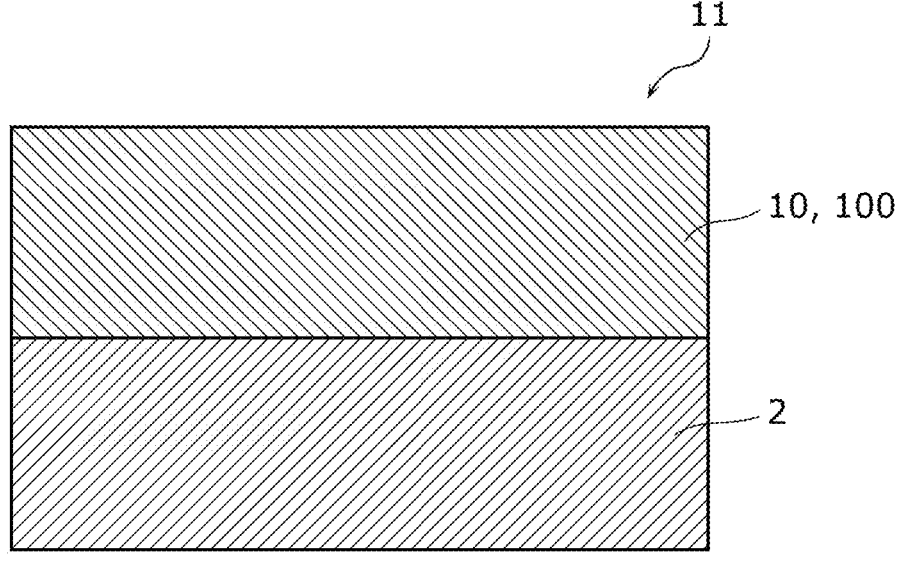
FIG. 1 illustrates an example of a configuration of a nitride semiconductor substrate according to a first example of an embodiment.

FIG. 1 illustrates an example of a configuration of nitride semiconductor substrate 11 according to a first example of the present embodiment. FIG. 2 illustrates an example of a configuration of nitride semiconductor substrate 21 according to a second example of the present embodiment. FIG. 3 illustrates an example of a configuration of nitride semiconductor substrate 31 according to a third example of the present embodiment.

Nitride semiconductor substrate 11 according to the first example includes substrate 2 and AlN-containing film 100. Nitride semiconductor substrate 21 according to the second example includes substrate 2 and AlN-containing film 200. Nitride semiconductor substrate 31 according to the third example includes substrate 2 and AlN-containing film 300.

AlN-containing film 100, AlN-containing film 200, and AlN-containing film 300 are films that contain AlN such as AlGaN. In the first to third examples of the present embodiment, the AlN-containing films are described as films that consist essentially of AlN.

Substrate 2 consists essentially of sapphire, for example. The material of substrate 2 is not limited to sapphire, and may be a substrate that consists essentially of one of sapphire, silicon carbide, or ScAlMgO$_4$. Note that substrates 2 in the first example, the second example, and the third example may be made of different materials.

AlN-containing film 100, AlN-containing film 200, and AlN-containing film 300 are thin films each provided above substrate 2. Note that AlN-containing film 100 in the first example is first AlN film 10. AlN-containing film 200 in the second example consists of first AlN film 10 and second AlN film 20. AlN-containing film 300 in the third example consists of first AlN film 10, second AlN film 20, and third AlN film 30.

First AlN film 10, second AlN film 20, and third AlN film 30 are hexagonal crystals, and are thin films including aggregates of crystal grains. First AlN film 10, second AlN film 20, and third AlN film 30 each consist essentially of one of AlN, Al$_x$Ga$_y$In$_{1-x-y}$N, or B$_z$Al$_w$Ga$_{1-z-w}$N, where $0.5 \leq x \leq 1$, $0.5 \leq y \leq 0.5$, $x+y \leq 1$, $0 \leq z \leq 0.5$, $0.5 \leq w \leq 1$, and $z+w \leq 1$. Thus, first AlN film 10, second AlN film 20, and third AlN film 30 may consist essentially of AlN, AlGaN, AlGaInN, BAlN, or BAlGaN.

Note that when first AlN film 10, second AlN film 20, and third AlN film 30 consist essentially of $Al_xGa_yIn_{1-x-y}N$, the number of Al atoms is 50% or more, as compared with a total number of Al, Ga, and In atoms. Further, when first AlN film 10, second AlN film 20, and third AlN film 30 consist essentially of $B_zAl_wGa_{1-z-w}N$, the number of Al atoms is 50% or more, as compared with a total number of B, Al, and Ga atoms.

The material compositions of first AlN film 10, second AlN film 20, and third AlN film 30 may be the same or may be different from one another.

The thicknesses of AlN-containing film 100, AlN-containing film 200, and AlN-containing film 300 are at most 10000 nm. The thicknesses of AlN-containing film 100, AlN-containing film 200, and AlN-containing film 300 may be at least 300 nm. Furthermore, the thicknesses of AlN-containing film 100, AlN-containing film 200, and AlN-containing film 300 are preferably in a range from 450 nm to 3000 nm, and are more preferably in a range from 600 nm to 2000 nm.

[Method for Manufacturing and Device that Manufactures Nitride Semiconductor Substrate]

Next, methods for manufacturing and a device that manufactures nitride semiconductor substrate 11 according to the first example, nitride semiconductor substrate 21 according to the second example, and nitride semiconductor substrate 31 according to the third example are to be described. The manufacturing device is used in all of the first example, the second example, and the third example.

Note that nitride semiconductor substrate 11 according to the first example is manufactured by a manufacturing method according to the first example, nitride semiconductor substrate 21 according to the second example is manufactured by a manufacturing method according to the second example, and nitride semiconductor substrate 31 according to the third example is manufactured by a manufacturing method according to the third example.

Manufacturing Method According to First Example

First, a manufacturing method according to the first example, which is for manufacturing nitride semiconductor substrate 11 according to the first example, is to be described.

Figure 4:
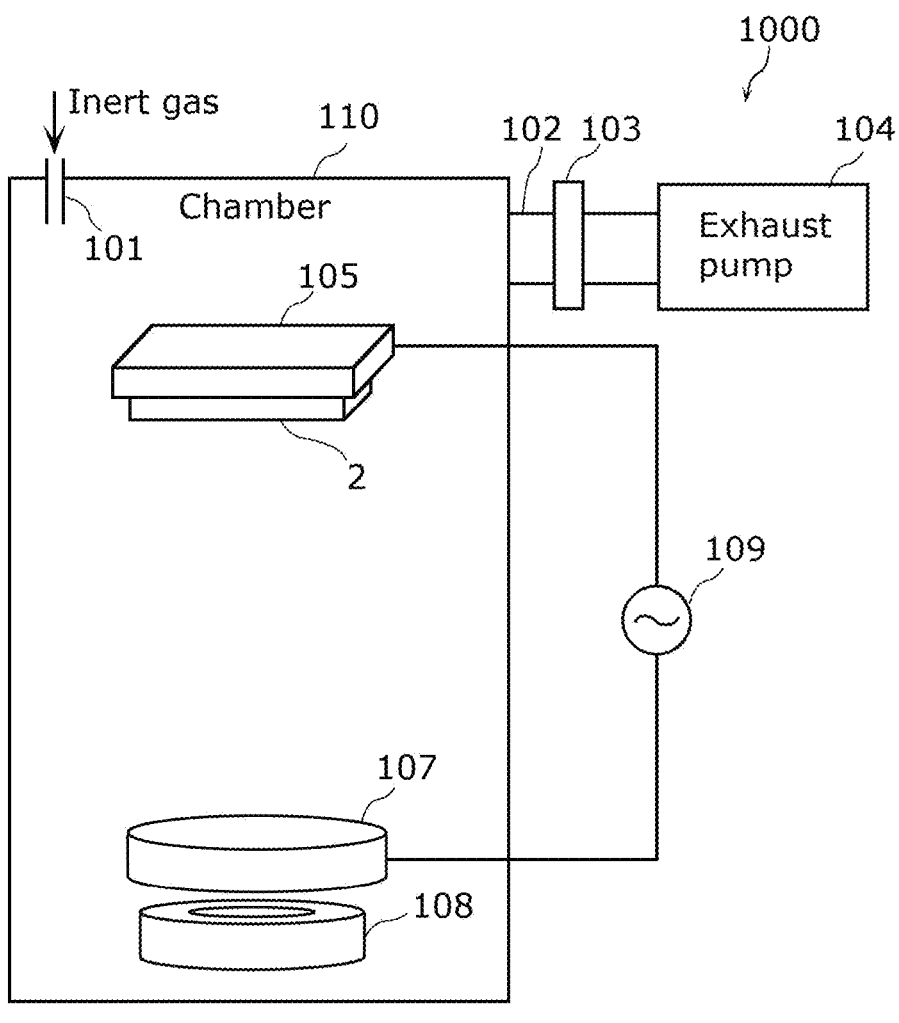
FIG. 4 is a schematic diagram illustrating an example of a configuration of a sputtering device according to the embodiment.
Figure 5:
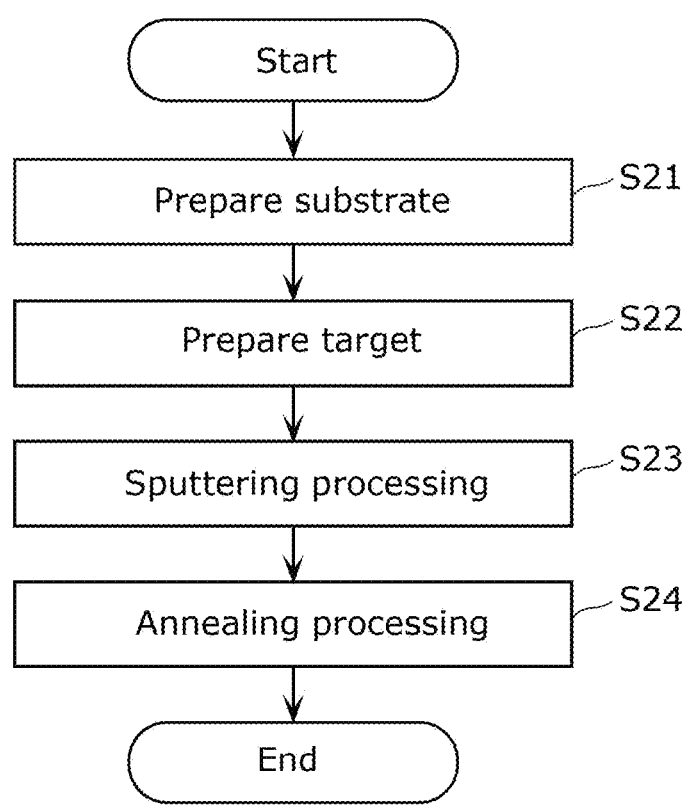
FIG. 5 is a flowchart illustrating an example of a method for manufacturing the nitride semiconductor substrate according to the first example of the embodiment.

FIG. 4 is a schematic diagram illustrating an example of a configuration of sputtering device 1000 according to the present embodiment. FIG. 5 is a flowchart illustrating an example of a method for manufacturing nitride semiconductor substrate 11 according to the first example of the present embodiment.

First, an example of a configuration of sputtering device 1000 illustrated in FIG. 4 is to be described. As illustrated in FIG. 4, sputtering device 1000 includes chamber 110, inlet pipe 101, exhaust pipe 102, valve 103, exhaust pump 104, substrate holder 105, permanent magnet 108, and high voltage power supply 109.

Chamber 110 is a substantially completely closed room in which substrate 2 and target 107 that is the material of first AlN film 10 are held, facing each other, and the pressure of a gas and the temperature inside chamber 110 can be arbitrarily set. In the following, the gas pressure inside chamber 110 when sputtering is performed is referred to as a sputtering pressure.

Inlet pipe 101 is a pipe for taking an inert gas supplied from the outside into chamber 110. An inert gas is a helium (He) gas, a nitrogen ($N_2$) gas, or an argon (Ar) gas, for instance. Inlet pipe 101 may be a single pipe for simultaneously supplying a plurality of types of gases.

A configuration may be adopted in which a plurality of inlet pipes 101 are connected to chamber 110. In addition, a gas other than an inert gas may be able to be taken in through inlet pipe 101. Examples of a gas other than an inert gas include a hydrogen ($H_2$) gas, an oxygen ($O_2$) gas, and ammonia ($NH_3$) gas. Inlet pipe 101 may have a mechanism for precisely controlling a flow rate of a gas to be supplied.

Exhaust pipe 102 is a pipe for exhausting gases inside chamber 110 to the outside.

Valve 103 adjusts the exhaust flow rate of exhaust pipe 102.

Exhaust pump 104 is a pump for exhausting gases inside chamber 110 to the outside through exhaust pipe 102 and valve 103.

Substrate holder 105 holds substrate 2 that is a wafer substrate. Note that substrate holder 105 may hold plural substrates 2 on which films are to be simultaneously deposited. Substrate holder 105 has a heating mechanism, and may be able to hold substrate 2 that is being heated at a temperature in a range from 500° C. to 650° C., an example of which is about 600° C.

Substrate holder 105 may have a mechanism that can arbitrarily control an angle at which target 107 faces substrate 2. Substrate holder 105 may be able to cause substrate 2 to rotate or revolve while a film is being deposited by sputtering.

Target 107 is held by a target holder. Note that the target holder may be able to hold plural types of targets 107 made of different materials, and switch target 107 to another target 107 that is to be used for sputtering. In this case, a configuration is achieved in which a plurality of different materials can be consecutively sputtered while chamber 110 is held in a high vacuum.

Furthermore, a configuration may be adopted in which a plurality of different materials can be simultaneously sputtered. The shape of target 107 is a round shape having a diameter of 10 cm, for example. Target 107 may have a rectangular shape or a shape other than the rectangular shape.

High voltage power supply 109 applies a high frequency voltage between substrate 2 and target 107. The high frequency voltage is a radio frequency (RF) voltage, for example. An RF voltage component of the high frequency voltage converts a gas supplied through inlet pipe 101 into plasma between substrate 2 and target 107.

The gas converted into plasma collides with target 107 due to an electric field made by a DC voltage component applied by a self-bias or an outside power source, and ejects (sputters) atoms on the surface of target 107. The ejected atoms travel toward and adhere onto substrate 2 according to kinetic energy given by sputtering.

As a result, a film the material of which is target 107 or a film made of a compound of the material of target 107 and a gas supplied through inlet pipe 101 is formed on substrate 2. The high frequency voltage may be in a range from 0 V to 5000 V, and may have a frequency of 13.56 MHz. The DC voltage component may be set to fall within a range from 0 V to 2000 V.

Note that sputtering device 1000 in FIG. 4 shows an example in which so-called RF sputtering in which a high frequency voltage is used, but DC sputtering in which a direct voltage is used may be performed. Furthermore, a voltage may be applied in a pulsed manner with a certain time width. In the case of DC sputtering, it is necessary to use a conductive material for target 107.

Permanent magnet 108 forms a magnetic field for confining electrons in plasma to the vicinity of target 107. Accordingly, the plasma density in the vicinity of target 107 is increased, thus increasing the sputtering speed. In addition, since plasma is kept away from substrate 2, this reduces a decrease in the crystal quality of first AlN film 10 due to emission of electrons and charged particles to substrate 2.

Note that sputtering device 1000 may not include permanent magnet 108. While a film is deposited by sputtering, permanent magnet 108 may be able to be moved arbitrarily. Target 107, and permanent magnet 108 and therearound are cooled with cooling water, and an increase in temperature of target 107 is reduced.

As sputtering device 1000 in FIG. 4, an example of a configuration of a sputtering up type (or a face down type) in which substrate 2 is disposed above and faces target 107 has been described. However, the configuration is not limited thereto. A sputtering down type (a face up type) in which substrate 2 is disposed below and faces target 107 may be used or a side sputtering type (a side face type) in which substrate 2 is disposed on the side of and faces target 107 may be used.

In FIG. 4, the distance between substrate 2 and target 107 is 14 cm, for example.

Next, a method for manufacturing nitride semiconductor substrate 11 is to be described, with reference to the flowchart in FIG. 5.

As shown in FIG. 5, a method for manufacturing nitride semiconductor substrate 11 roughly includes first process S21, second process S22, third process S23, and fourth process S24.

First process S21 is a process for preparing substrate 2. Specifically, in first process S21, substrate 2 is prepared in substrate holder 105 in sputtering device 1000. Substrate 2 is, for example, a sapphire substrate as mentioned above. This sapphire substrate may have a surface tilted relative to the (0001) surface at an angle in a range from 0.1° to 1.0° relative to the [1-100] direction (the m-axis direction) or the [11-20] direction (the a-axis direction) of sapphire, for example.

A step-terrace structure consisting of a single atom layer or a single molecule layer may be formed on the surface of the sapphire substrate. The back surface of the sapphire substrate may be ground so as to be an optically mirror surface, or may be subjected to a rough surface process.

A layer consisting essentially of AlN or a material other than AlN may be deposited on the back surface of the sapphire substrate. Substrate holder 105 may be configured to hold four or more 2-inch wafer substrates. Substrate holder 105 may be configured to hold substrates having a size greater than 2 inches.

As a stage previous to first process S21, the following process may be performed.

First, substrate 2 is disposed in a load-lock chamber that is not illustrated in FIG. 4, is disposed next to chamber 110, and can independently release and evacuate gases. After gases are discharged from the load-lock chamber to make the degree of vacuum therein sufficiently high, substrate 2 may be transferred from the load-lock chamber to a sputtering chamber in a vacuum, and may be disposed on substrate holder 105 in chamber 110.

Accordingly, when substrate 2 is disposed on substrate holder 105, chamber 110 is prevented from being exposed to air, and thus the inside of chamber 110 can be always maintained at a high degree of vacuum. Thus, the crystal quality of AlN deposited by sputtering can be stably controlled. By the time when substrate 2 is transferred into chamber 110, it is preferable to reduce the pressure inside the load-lock chamber down to $1\times10^{-4}$ Pa or lower, for example.

In second process S22, target 107 that is a material for depositing a film is prepared in sputtering device 1000. Note that the preparation process may include first process S21 and second process S22. Target 107 is an AlN sintered body, for example.

After substrate 2 and target 107 are disposed in first process S21 and second process S22 and before depositing a film by sputtering starts in third process S23, it is preferable to evacuate chamber 110 for a sufficient time to lower the pressure in chamber 110. Note that at this time, it is preferable to lower the pressure in chamber 110 in a state in which the temperature of substrate 2 is maintained at a temperature same as or higher than the temperature for depositing a film by sputtering.

Accordingly, the residual gas concentration in chamber 110 can be reduced, and the crystal quality of AlN deposited by sputtering can be stably controlled. Since chamber 110 is evacuated while heating substrate 2, moisture absorbed in the surface of substrate 2 can be effectively removed before substrate 2 is disposed inside chamber 110. Thus, the crystal quality of AlN deposited by sputtering can be stably controlled. Before third process S23 starts, it is preferable to reduce the pressure in chamber 110 down to $6\times10^{-5}$ Pa or lower, for example.

Third process S23 is a deposition process of depositing an AlN film (first AlN film 10). Specifically, in third process S23, target 107 is sputtered at a sputtering pressure lower than 0.5 Pa, thus depositing first AlN film 10 that includes a composition of the target material on substrate 2. Third process S23 may also be referred to as a sputtering process.

To give a more specific description, the sputtering pressure in chamber 110 is adjusted to a desired pressure that is at most 0.5 Pa by controlling the flow rate of a gas supplied trough the inlet pipe, the speed of exhausting a gas by exhaust pump 104, and the degree of opening of valve 103. The heating mechanism of substrate holder 105 maintains the surface temperature of substrate 2 at a temperature in a range from about 500° C. to 650° C., an example of which is about 600° C.

Inlet pipe 101 supplies a nitrogen gas, for example, as an inert gas. The flow rate of a nitrogen gas is in a range from 10 standard cubic centimeters per minute (sccm) to 100 sccm, for example. The unit "sccm" is a unit standardized at 0° C. and 1 atmospheric pressure.

High voltage power supply 109 applies a high frequency voltage of hundreds of volts, and a frequency of the high frequency voltage is 13.56 MHz, for example. Power supplied from high voltage power supply 109 to target 107 is in a range from 200 W to 1000 W, for example. A time for sputtering may be determined according to a desired thickness of first AlN film 10 to be deposited and power to be supplied to the target.

Note that before depositing first AlN film 10 on substrate 2 starts, a process may be provided in which in a state where a shutter is disposed between substrate 2 and target 107, plasma is generated between the shutter and target 107, and target 107 is sputtered.

In this manner, since target 107 is sputtered in a state in which atoms sputtered from target 107 are blocked by the shutter and thus cannot reach substrate 2, impurities adhering to the surface of target 107 can be removed.

After the surface of target 107 is sputtered for a sufficient time, the shutter disposed between substrate 2 and target 107 may be removed, and depositing first AlN film 10 on substrate 2 may start. Accordingly, the crystal quality of first AlN film 10 deposited by sputtering thereafter can be stably controlled.

The thickness of first AlN film 10 included in nitride semiconductor substrate 11 according to the first example may be in a range from 300 nm to 1200 nm, for example. In order to reduce cracks generated in first AlN film 10 due to an annealing process described later, the sputtering pressure in chamber 110 may be decreased as the thickness of first AlN film 10 is greater. For example, the sputtering pressure in chamber 110 may be at most 0.05 Pa.

More specifically, in order to reduce cracks, when the sputtering pressure in chamber 110 is at most P (Pa) and the thickness of the nitride layer is at most T (nm), a set of (P, T) may satisfy at least one of (0.05, 640), (0.1, 480), or (0.2, 320). Alternatively, sputtering pressure P for and thickness T of the nitride layer may be selected so as to fall within the following ranges.

Specifically, P and T may be selected from the ranges included in at least one of (1.1) or (1.2), when (1.1) satisfies $P \leq 31117 \times T^{-2.06}$ and $300 \leq T \leq 640$, and (1.2) satisfies $P \leq 0.05$ and $T \geq 640$.

More preferably, the set of (P, T) may satisfy at least one of (0.05, 560) or (0.1, 400). In this case, when the sputtering pressure and the thickness have values out of the above ranges, sputtering pressure P for and thickness T of the nitride layer may be selected so as to fall within the following ranges.

Specifically, P and T may be selected from the ranges included in at least one of (2.1) or (2.2), when (2.1) satisfies $P \leq 1436 \times T^{-1.61}$ and $300 \leq T \leq 560$, and (2.2) satisfies $P \leq 0.05$ and $T \geq 560$.

More preferably, the set of (P, T) may satisfy at least one of (0.03, 850), (0.05, 480), or (0.1, 320). In this case, when the sputtering pressure and the thickness have values out of the above ranges, sputtering pressure P for and thickness T of the nitride layer may be selected so as to fall within the following ranges.

Specifically, P and T may be selected from the ranges included in at least one of (3.1) or (3.2), when (3.1) satisfies $P \leq 76.6 \times T^{-1.17}$ and $300 \leq T \leq 850$, and (3.2) satisfies $P \leq 0.03$ and $T \geq 850$. A range ±10% the above numerical ranges of P and T is effective.

Fourth process S24 is an annealing process of annealing the AlN film (first AlN film 10) deposited in the deposition process (third process S23) at at least 1500° C. Specifically, in fourth process S24, substrate 2 on which first AlN film 10 is deposited is subjected to heating processing at at least 1500° C., or more preferably at a temperature in a range from 1650° C. to 1750° C. Fourth process S24 may also be referred to as annealing processing.

To give a more specific description, first, substrate 2 on which first AlN film 10 is deposited in third process S23 is disposed inside an annealing device. It is sufficient if the annealing device can perform annealing processing, and thus the annealing device may be a different device from sputtering device 1000 or may be sputtering device 1000. Substrate 2 is disposed inside the annealing device in the following manner.

Specifically, first AlN film 10 is placed in a gas-tight state in which a principal surface of deposited first AlN film 10 is covered with a cover member for inhibiting components of the material of first AlN film 10 from dissociating from the principal surface thereof. Here, "dissociate" refers to components of first AlN film 10 (such as nitrogen, aluminum, gallium, indium, and boron) leaving and going out of the principal surface thereof, and includes sublimation, evaporation, and diffusion. The "principal surface" of first AlN film 10 (or substrate 2) refers to, when another material is stacked (or formed) thereon, a surface on the side where the other material is stacked (or formed).

Note that when the cover member, for instance, is not disposed in an inert gas atmosphere, substrate 2 on which first AlN film 10 is deposited is exposed to the atmosphere between the deposition process (third process S23) and the annealing process (fourth process S24).

Next, the annealing device is evacuated and placed in a vacuum in order to exhaust impurities inside the annealing device, and thereafter an inert gas or a mixed gas is supplied thereinto to replace gases. After that, the temperature of substrate 2 on which first AlN film 10 is deposited is increased while maintaining first AlN film 10 is in the gas-tight state described above. The speed for increasing the temperature is referred to as a rate of temperature increase. The rate of temperature increase may be 18.9° C. per minute, for example.

After the temperature of substrate 2 on which first AlN film 10 is deposited reaches a predetermined temperature (for example, in a range from 1650° C. to 1750° C.), first AlN film 10 is annealed by maintaining the temperature of substrate 2 on which first AlN film 10 is deposited at the predetermined temperature for a predetermined time. The temperature of substrate 2 on which first AlN film 10 is deposited while being annealed is referred to as an annealing temperature, and a time for maintaining substrate 2 at the annealing temperature is referred to as an annealing time.

Substrate 2 may be annealed at a higher annealing temperature in order to decrease the threading dislocation density of first AlN film 10 after being annealed. The annealing temperature is preferably in a range from 1700° C. to 1750° C., and is more preferably in a range from 1725° C. to 1750° C.

The annealing time may be in a range from 3 hours to 12 hours, for example. In order to decrease the threading dislocation density of first AlN film 10, the annealing time may be longer as the thickness of first AlN film 10 is greater. When the annealing temperature is excessively high or the annealing time is excessively long, the flatness of the surface of first AlN film 10 after the annealing processing may be decreased. In order to decrease the threading dislocation density without impairing the flatness of the surface of first AlN film 10, the annealing temperature and the annealing time may be increased in a range where the surface flatness is not impaired.

After substrate 2 on which first AlN film 10 is deposited is maintained at the annealing temperature for the annealing time, the temperature of substrate 2 on which first AlN film 10 is deposited is decreased down to 100° C. or lower. After that, substrate 2 on which first AlN film 10 is deposited is taken out of the annealing device. The speed for decreasing the temperature is referred to as a rate of temperature decrease. The rate of temperature decrease may be in a range from 1° C. to 100° C. per minute, for example. In addition, the rate of temperature decrease may be constant or vary with time.

At this time, substrate 2 on which first AlN film 10 is deposited is annealed in an atmosphere of an inert gas such as a nitrogen gas, an argon gas, or a helium gas, or in an atmosphere of a mixed gas resulting from adding an ammonia gas or a carbon monoxide gas to the inert gas.

The pressure of the inert gas or the mixed gas in the annealing device is set to a pressure in a range from 0.5 atmospheric pressure to 2 atmospheric pressure, due to, for instance, an explosion-proof strength at a high temperature, although the range in which annealing effects are expected to be achieved is a range from 0.1 atmospheric pressure to 10 atmospheric pressure (a range from 76 Torr to 7600 Torr). Theoretically, if the partial pressures of nitrogen included in the gases are higher, first AlN film 10 is expected to have high crystallinity and less surface roughness, but the pressure of a gas may be set to about 1 atmospheric pressure. Here, the relation of pressure units is 1 atmospheric pressure=101,325 Pa (pascal)=760 Torr.

Such annealing can decrease the threading dislocation density of first AlN film 10 and improve crystallinity.

Note that the annealing device may be a heating container having a certain volume, a function of controlling the substrate temperature to fall within a range from 500° C. to 1800° C., and a function of controlling the pressures and flow rates of an inert gas and a mixed gas that are to be introduced into the device and replace gases therein.

In the annealing device, substrate 2 on which first AlN film 10 is deposited and which is disposed in the device is covered with a cover member or alternatively, a cover member is disposed such that the member faces upward, and substrate 2 on which first AlN film 10 is deposited is disposed, facing downward such that first AlN film 10 is in contact with the cover member. Furthermore, a mechanism that applies a predetermined pressure may be provided between the cover member and the substrate. The annealing device may be able to perform heat processing simultaneously on plural substrates 2 on each of which first AlN film 10 is deposited.

Next, the gas-tight state in fourth process S24 is to be described.

The gas-tight state is a state which is achieved in the annealing device, and in which the principal surface of first AlN film 10 is covered with a cover member for inhibiting components of first AlN film 10 (such as nitrogen, aluminum, gallium, and indium) from dissociating from the principal surface of first AlN film 10. Thus, the gas-tight state inhibits, using a physical technique, components of first AlN film 10 from dissociating from the principal surface thereof. This state is a residence state in which a gas between the cover member and the principal surface of first AlN film 10 does not substantially flow.

Nitride semiconductor substrate 11 is annealed in such a gas-tight state, thus inhibiting the principal surface of first AlN film 10 from being roughened due to dissociation of components of first AlN film 10 from the principal surface thereof. In addition, annealing at a higher temperature is possible, so that nitride semiconductor substrate 11 in which high-quality first AlN film 10 having a flat surface is formed can be produced.

Target 107 prepared in second process S22 described above is not limited to an AlN sintered body, and may be an Al, AlGaN, AlNGaIn, BAlN, or BAlGaN sintered body.

Note that the inert gas in the sputtering in third process S23 is not limited to a nitrogen gas, and may be an argon gas, a helium gas, or a mixed gas of a nitrogen gas, an argon gas, and a helium gas.

Note that the gas-tight state in the annealing is made in order to readily obtain a flat surface of a nitride layer. Accordingly, the surface may not be covered under an annealing condition under which roughness is not substantially generated due to components being removed from the surface or if a rough structure is intentionally made in the surface of first AlN film 10.

Manufacturing Method According to Second Example

Figure 6:
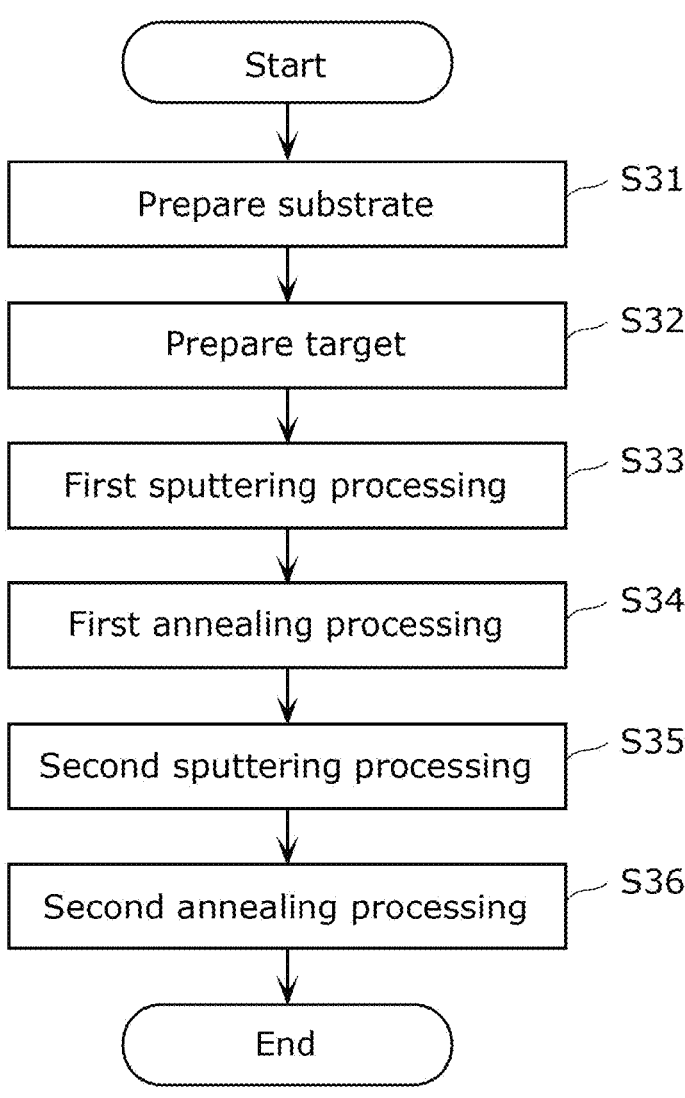
FIG. 6 is a flowchart illustrating an example of a method for manufacturing the nitride semiconductor substrate according to the second example of the embodiment.

Next, a manufacturing method according to the second example, which is for manufacturing nitride semiconductor substrate 21 according to the second example, is to be described. FIG. 6 is a flowchart illustrating an example of a method for manufacturing nitride semiconductor substrate 21 according to the second example of the present embodiment.

As shown in FIG. 6, the method for manufacturing nitride semiconductor substrate 21 roughly includes first process S31, second process S32, third process S33, fourth process S34, fifth process S35, and sixth process S36. Here, first process S31 and second process S32 are the same as first process S21 and second process S22 in the manufacturing method according to the first example.

Third process S33 in the second example is a deposition process of depositing an AlN film (first AlN film 10). Specifically, in third process S33, target 107 is sputtered at a sputtering pressure lower than 0.5 Pa, thus depositing first AlN film 10 that includes a composition of the target material on substrate 2. Thus, third process S33 is first sputtering processing.

To give a more specific description, the sputtering pressure in chamber 110 is adjusted to a desired pressure that is at most 0.5 Pa by controlling the flow rate of a gas supplied trough the inlet pipe, the speed of exhausting a gas by exhaust pump 104, and the degree of opening of valve 103. The heating mechanism of substrate holder 105 maintains the surface temperature of substrate 2 at a temperature in a range from about 500° C. to 650° C., an example of which is about 600° C.

Inlet pipe 101 supplies a nitrogen gas, for example, as an inert gas. The flow rate of a nitrogen gas is in a range from 10 sccm to 100 sccm, for example.

High voltage power supply 109 applies a high frequency voltage of hundreds of volts, and a frequency of the high frequency voltage is 13.56 MHz, for example. Power supplied from high voltage power supply 109 to target 107 is in a range from 200 W to 1000 W, for example. A time for sputtering may be determined according to a desired thickness of first AlN film 10 to be deposited and power to be supplied to the target.

Note that before depositing first AlN film 10 on substrate 2 starts, a process may be provided in which in a state where a shutter is disposed between substrate 2 and target 107, plasma is generated between the shutter and target 107, and target 107 is sputtered.

In this manner, since target 107 is sputtered in a state in which atoms sputtered from target 107 are blocked by the shutter and thus cannot reach substrate 2, impurities adhering to the surface of target 107 can be removed. After the surface of target 107 is sputtered for a sufficient time, the shutter disposed between substrate 2 and target 107 may be removed, and depositing first AlN film 10 on substrate 2 may start. Accordingly, the crystal quality of first AlN film 10 deposited by sputtering thereafter can be stably controlled.

The thickness of first AlN film 10 included in nitride semiconductor substrate 21 according to the second example may be in a range from 100 nm to 900 nm, for example. The thickness of first AlN film 10 included in nitride semiconductor substrate 21 according to the second example is preferably in a range from 150 nm to 750 nm, and is more preferably in a range from 200 nm to 600 nm.

In order to reduce cracks generated in first AlN film 10 due to an annealing process described later, the sputtering pressure in chamber 110 may be decreased as the thickness of first AlN film 10 is greater. For example, the sputtering pressure in chamber 110 may be at most 0.05 Pa.

More specifically, in order to reduce cracks, when the sputtering pressure in chamber 110 is at most P (Pa) and the thickness of the nitride layer is at most T (nm), a set of (P, T) may satisfy at least one of (0.05, 640), (0.1, 480), or (0.2, 320). Alternatively, sputtering pressure P and thickness T of the nitride layer may be selected so as to fall within the following ranges.

Specifically, P and T may be selected from the ranges included in at least one of (1.1) or (1.2), when (1.1) satisfies $P \leq 31117 \times T^{-2.06}$ and $300 \leq T \leq 640$, and (1.2) satisfies $P \leq 0.05$ and $T \geq 640$.

More preferably, the set of (P, T) may satisfy at least one of (0.05, 560) or (0.1, 400). In this case, when the sputtering pressure and the thickness have values out of the above ranges, sputtering pressure P and thickness T of the nitride layer may be selected so as to fall within the following ranges.

Specifically, P and T may be selected from the ranges included in at least one of (2.1) or (2.2), when (2.1) satisfies $P \leq 1436 \times T^{-1.61}$ and $300 \leq T \leq 560$, and (2.2) satisfies $P \leq 0.05$ and $T \geq 560$.

More preferably, the set of (P, T) may satisfy at least one of (0.03, 850), (0.05, 480), or (0.1, 320). In this case, when the sputtering pressure and the thickness have values out of the above ranges, sputtering pressure P and thickness T of the nitride layer may be selected so as to fall within the following ranges.

Specifically, P and T may be selected from the ranges included in at least one of (3.1) or (3.2), when (3.1) satisfies $P \leq 76.6 \times T^{-1.17}$ and $300 \leq T \leq 850$, and (3.2) satisfies $P \leq 0.03$ and $T \geq 850$.

Fourth process S34 is an annealing process of annealing the AlN film (first AlN film 10) deposited in the deposition process (third process S33) at at least 1500° C. Specifically, in fourth process S34, substrate 2 on which first AlN film 10 is deposited is subjected to annealing processing at at least 1500° C., or more preferably at a temperature in a range from 1650° C. to 1750° C. Thus, fourth process S34 is first annealing processing.

To give a more specific description, first, substrate 2 on which first AlN film 10 is deposited in third process S33 is disposed inside an annealing device. Substrate 2 is disposed inside the annealing device in the following manner.

Specifically, first AlN film 10 is placed in a gas-tight state in which a principal surface of deposited first AlN film 10 is covered with a cover member for inhibiting components of the nitride semiconductor from dissociating from the principal surface thereof also in the second example, similarly to the first example.

Next, the annealing device is evacuated and placed in a vacuum in order to exhaust impurities inside the annealing device, and thereafter an inert gas or a mixed gas is supplied thereinto to replace gases. After that, the temperature of substrate 2 on which first AlN film 10 is deposited is increased while maintaining first AlN film 10 in the gas-tight state described above. At this time, the rate of temperature increase may be 18.9° C. per minute, for example.

After the temperature of substrate 2 on which first AlN film 10 is deposited reaches a predetermined temperature (in a range from 1650° C. to 1750° C., for example), first AlN film 10 is annealed by maintaining the temperature of substrate 2 on which first AlN film 10 is deposited at the predetermined temperature for a predetermined time.

Note that in the second example, the annealing temperature and the annealing time for decreasing the threading dislocation density of first AlN film 10 are the same as those in fourth process S24 in the first example.

In the second example, the pressure of an inert gas or a mixed gas in the annealing device may be set to the same pressure as that in fourth process S24 in the first example.

Subsequently, fifth process S35 and sixth process S36 are performed.

Fifth process S35 is a deposition process of depositing an AlN film (second AlN film 20). Thus, fifth process S35 is the same as third process S33, and fifth process S35 is second sputtering processing.

Sixth process S36 is an annealing process of annealing the AlN film (second AlN film 20) deposited in the deposition process (fifth process S35) at at least 1500° C. Thus, sixth process S36 is the same as fourth process S34, and sixth process S36 is second annealing processing.

Thus, in the manufacturing method according to the second example of the present embodiment, the deposition process and the annealing process are performed multiple times.

Here, a difference between fifth process S35 and third process S33 is mainly and briefly described.

In fifth process S35, second AlN film 20 is deposited above first AlN film 10 that has been subjected to annealing processing in fourth process S34. Specifically, in fifth process S35, target 107 is sputtered at a sputtering pressure lower than 0.5 Pa, thus depositing second AlN film 20 that includes a composition of the target material.

In fifth process S35, the procedure after the removal of the shutter and up to the start of depositing second AlN film 20 above first AlN film 10 is the same as third process S33. However, sputtering conditions such as the surface temperature of substrate 2, the sputtering pressure, the RF output, the type of a gas to be supplied, the flow rate of a gas to be supplied, and the target material may be the same as or different from the conditions for depositing first AlN film 10 (third process S33). For example, the sputtering pressure for depositing second AlN film 20 may be set to a pressure higher than the sputtering pressure for depositing first AlN film 10.

The thickness of second AlN film 20 may be in a range from 100 nm to 900 nm, for example. Further, the thickness of second AlN film 20 is preferably in a range from 150 nm to 750 nm, and is more preferably in a range from 200 nm to 600 nm. Note that first AlN film 10 and second AlN film 20 may have the same thickness or different thicknesses. For example, the thickness of second AlN film 20 may be greater than the thickness of first AlN film 10.

In order to reduce cracks generated in first AlN film 10 and second AlN film 20 due to the annealing process in sixth process S36, the sputtering pressure in chamber 110 may be decreased as the thicknesses of first AlN film 10 and second AlN film 20 are greater. For example, the sputtering pressure in chamber 110 in third process S33 and fifth process S35 may be at most 0.05 Pa.

Next, a difference between sixth process S36 and fourth process S34 is mainly and briefly described.

In sixth process S36, substrate 2 on which first AlN film 10 and second AlN film 20 are deposited is subjected to annealing processing at at least 1500° C., or more preferably at a temperature in a range from 1650° C. to 1750° C.

In sixth process S36, the procedure up to the start of increasing the temperature for annealing processing is the same as fourth process S34. However, annealing processing conditions such as the rate of temperature increase, the rate of temperature decrease, the annealing temperature, and the annealing time may be the same as or different from the annealing processing in fourth process S34.

For example, the annealing time for the annealing processing in sixth process S36 may be longer than the annealing time for the annealing processing in fourth process S34. Further, the annealing temperature for the annealing processing in sixth process S36 may be higher than the annealing temperature for the annealing processing in fourth process S34.

After substrate 2 on which first AlN film 10 and second AlN film 20 are deposited is maintained at the annealing temperature for the annealing time, the temperature of substrate 2 on which first AlN film 10 and second AlN film 20 are deposited is decreased down to 100° C. or lower. Then, substrate 2 is taken out of the annealing device. The rate of temperature decrease may be in a range from 1° C. to 100° C. per minute, for example. In addition, the rate of temperature decrease may be constant or vary with time.

Here, Non Patent Literature (NPL) 1 is to be described. For example, in a nitride semiconductor substrate in NPL 1, a first AlN layer and a second AlN layer are deposited on a substrate, and the nitride semiconductor substrate is manufactured by using a manufacturing method in which Al and AlN targets are used for the first and second AlN layers, respectively. Accordingly, the first AlN layer and the second AlN layer have reversed polarities in the nitride semiconductor substrate in NPL 1.

On the other hand, in the present example, an AlN target is used as target 107 in third process S33 and fifth process S35. An Al target may be used as target 107, yet the material of target 107 is preferably the same for third process S33 and fifth process S35.

Accordingly, in the present example, first AlN film 10 and second AlN film 20 have the same polarity, and have an Al polarity. Note that there are cases where plural layers having different polarities may be formed in nitride semiconductor substrate 21 in the present example, yet nearly the entirety of first AlN film 10 and second AlN film 20 has an Al polarity, and the thickness of a layer having an N polarity is at most 200 nm.

Manufacturing Method According to Third Example

Figure 7:
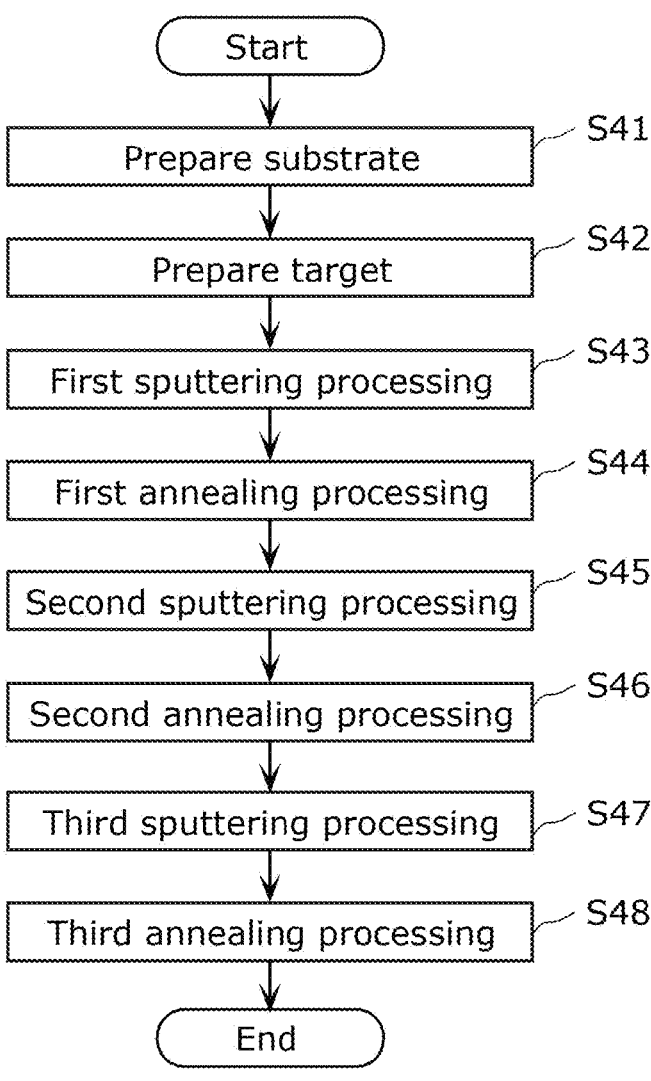
FIG. 7 is a flowchart illustrating an example of a method for manufacturing the nitride semiconductor substrate according to the third example of the embodiment.

Next, a manufacturing method according to the third example, which is for manufacturing nitride semiconductor substrate 31 according to the third example, is to be described. FIG. 7 is a flowchart illustrating an example of a method for manufacturing nitride semiconductor substrate 31 according to the third example of the present embodiment.

As shown in FIG. 7, a method for manufacturing nitride semiconductor substrate 31 roughly includes first process S41, second process S42, third process S43, fourth process S44, fifth process S45, sixth process S46, seventh process S47, and eighth process S48. Here, first process S41 to sixth process S46 in the method for manufacturing nitride semiconductor substrate 31 according to the third example are the same as first process S31 to sixth process S36 in the method for manufacturing nitride semiconductor substrate 21 according to the second example.

Seventh process S47 is a deposition process of depositing an AlN film (third AlN film 30). Thus, seventh process S47 is the same as third process S43 and fifth process S45, and is third sputtering processing.

Eighth process S48 is an annealing process of annealing the AlN film (third AlN film 30) deposited in the deposition process (seventh process S47) at at least 1500° C. Thus, eighth process S48 is the same as fourth process S44 and sixth process S46, and is third annealing processing.

Thus, in the manufacturing method according to the third example of the present embodiment, the deposition process and the annealing process are performed multiple times.

Here, a difference between seventh process S47 and fifth process S45 (that is, fifth process S35 in the second example) is mainly and briefly described.

In seventh process S47, third AlN film 30 is deposited above second AlN film 20 that has been subjected to annealing processing in fifth process S45.

In seventh process S47, the procedure after the removal of the shutter and up to the start of depositing third AlN film 30 above second AlN film 20 is the same as fifth process S45. However, sputtering conditions such as the surface temperature of substrate 2, the sputtering pressure, the RF output, the type of a gas to be supplied, the flow rate of a gas to be supplied, and the target material may be same as or different from the conditions for depositing first AlN film 10 and second AlN film 20.

The thickness of third AlN film 30 may be in a range from 100 nm to 900 nm. Further, the thickness of third AlN film 30 is preferably in a range from 150 nm to 750 nm, and is more preferably in a range from 200 nm to 600 nm.

Note that first AlN film 10, second AlN film 20, and third AlN film 30 may have the same thickness or different thicknesses. In addition, the deposition method may be a sputtering method or another deposition method such as metal organic vapor phase epitaxy (MOVPE), or may be a combination thereof. Furthermore, a different sputtering device may be used each time a film is deposited, and deposition devices and annealing devices may be disposed linearly and used when substrates are manufactured.

Next, a difference between eighth process S48 and sixth process S46 (that is, sixth process S36 in the second example) is mainly and briefly described.

In eighth process S48, substrate 2 on which first AlN film 10, second AlN film 20, and third AlN film 30 are deposited is subjected to annealing processing at at least 1500° C., or more preferably at a temperature in a range from 1650° C. to 1750° C.

In eighth process S48, the procedure up to the start of increasing the temperature for the annealing processing is the same as sixth process S46. However, annealing processing conditions such as the rate of temperature increase, the rate of temperature decrease, the annealing temperature, and the annealing time may be the same as or different from the annealing processing in fourth process S44 and sixth process S46.

After substrate 2 on which first AlN film 10, second AlN film 20, and third AlN film 30 are deposited is maintained at the annealing temperature for the annealing time, the temperature of substrate 2 is decreased down to 100° C. or lower. Then, substrate 2 is taken out of the annealing device. The rate of temperature decrease may be in a range from 1° C. to 100° C. per minute, for example. In addition, the rate of temperature decrease may be constant or vary with time.

Note that although not illustrated in FIG. 7, a deposition process and an annealing process may be further performed after eighth process S48. For example, after eighth process S48, the deposition process and the annealing process may each be performed one or more times, but preferably are each performed at most four times to simplify the manufacturing method.

Accordingly, also in the present example, first AlN film 10, second AlN film 20, and third AlN film 30 have the same polarity, and have an Al polarity. Note that there are cases where plural layers having different polarities may be formed in nitride semiconductor substrate 31 in the present example, yet nearly the entirety of first AlN film 10, second AlN film 20, and third AlN film 30 has an Al polarity, and the thickness of a layer having an N polarity is at most 200 nm.

To summarize the above, the manufacturing method according to the present embodiment includes a preparation process of preparing substrate 2, at least one deposition process, and at least one annealing process. Each deposition process is a process of depositing an AlN film (first AlN film 10, second AlN film 20, or third AlN film 30) having a thickness in a range from 100 nm to 900 nm above substrate 2, as an example. Each annealing process is a process of annealing the AlN film deposited in the deposition process at at least 1500° C.

Note that the deposition process and the annealing process are each performed multiple times. Thus, as shown by the manufacturing methods according to the second and third examples, the deposition process is performed multiple times and the annealing process is performed multiple times. The present embodiment is not limited thereto, and at least one of the deposition process or the annealing process may be performed multiple times. Stated differently, for example, the deposition process may be performed once and the annealing process may be performed multiple times, and furthermore, the deposition process may be performed multiple times and the annealing process may be performed once.

[Evaluation 1 of Nitride Semiconductor Substrate]

Next, results of evaluating threading dislocation densities of AlN-containing film 100, AlN-containing film 200, and AlN-containing film 300, while changing manufacturing conditions in the manufacturing methods according to the first example, the second example, and the third example of the present embodiment are to be described.

FIG. 8 is an example drawing illustrating a table showing crystallinity of nitride semiconductor substrates 11, 21, and 31 according to the present embodiment. Note that, more specifically, FIG. 8 illustrates results of an X-ray diffractometer (XRD) measuring nitride semiconductor substrates 11, 21, and 31.

Sample substrates (substrate numbers) shown in FIG. 8 correspond to nitride semiconductor substrates 11, 21, and 31 according to the present embodiment. FIG. 8 shows full widths at half maximum of X-ray diffraction rocking curves (XRCs) of AlN-containing film 100, AlN-containing film 200, and AlN-containing film 300 for thicknesses of and annealing temperatures and annealing times for first AlN film 10, second AlN film 20, and third AlN film 30 according to the present embodiment. Specifically, full widths at half maximum of XRCs of the (0002) planes and the (10-12) planes of AlN-containing film 100, AlN-containing film 200, and AlN-containing film 300 are shown.

The crystallinity of AlN-containing films 100, 200, and 300 correlates with the values of full widths at half maximum (FWHMs) at diffraction peaks, which are obtained by XRC measurement on the (0002) planes and the (10-12) planes. The smaller an XRC FWHM is, that is, the sharper an obtained diffraction peak is, the better crystallinity is. Note that the unit of an XRC FWHM is arcsec (") indicating an angle.

The surface states of AlN-containing films 100, 200, and 300 are expressed by "flat", "pits", and "rough". The expression "flat" means a state in which the flatness of a surface is the highest, "rough" means a state in which the surface is rough, and "pits" means an intermediate state between "flat" and "roug h".

The sample substrates to which the substrate numbers shown in FIG. 8 are given correspond to nitride semiconductor substrates 11, 21, and 31 manufactured by the manufacturing methods according to the present embodiment. In the following, sample substrates having the given substrate numbers are denoted by their substrate numbers such as substrate number A1.

In FIG. 8, when the thickness of second AlN film 20 is 0 nm, this means that second annealing processing is performed without depositing second AlN film 20 in second sputtering processing after first annealing processing. Note that the sample substrate is exposed to the atmosphere between the first annealing processing and the second annealing processing.

Similarly, when the thickness of third AlN film 30 is 0 nm, this means that third annealing processing is performed without depositing third AlN film 30 in third sputtering processing after the second annealing processing. Note that the sample substrate is exposed to the atmosphere between the second annealing processing and the third sputtering processing.

As described above, with regard to a sample with second AlN film 20 and third AlN film 30 whose thicknesses are 0 nm, films are not deposited by the second and third sputtering processing, and thus such a sample corresponds to nitride semiconductor substrate 11 manufactured by the manufacturing method according to the first example of the present embodiment.

Specifically, substrate numbers A1, A2, A3, B1, B2, B3, C1, C2, D1, and D2 each correspond to nitride semiconductor substrate 11.

Further, when the thickness of second AlN film 20 is greater than 0 nm, the sample substrate is exposed to the atmosphere between the first annealing processing and the second sputtering processing.

Thus, as described above, a sample with second AlN film 20 having a thickness greater than 0 nm corresponds to nitride semiconductor substrate 21 manufactured by the manufacturing method according to the second example of the present embodiment.

Specifically, substrate numbers F1, F2, F3, F4, G1, H1, H2, and H3 each correspond to nitride semiconductor substrate 21.

Note that substrate number F1 is assumed to be a nitride semiconductor substrate according to a comparative example since the annealing temperature in the first annealing processing is lower than 1500° C.

Further, when the thickness of third AlN film 30 is greater than 0 nm, the sample substrate is exposed to the atmosphere between the second annealing processing and the third sputtering processing.

Thus, as described above, a sample with third AlN film 30 having a thickness greater than 0 nm corresponds to nitride semiconductor substrate 31 manufactured by the manufacturing method according to the third example of the present embodiment.

Specifically, substrate numbers G2 and H4 each correspond to nitride semiconductor substrate 31.

Here, XRC FWHMs for thicknesses of and annealing temperatures and annealing times for first AlN film 10, second AlN film 20, and third AlN film 30 are to be described. The following description is given, assuming that the smaller XRC FWHM of the (10-12) plane is, the higher crystallinity is.

As shown by substrate numbers A1, A2, and A3, when the thickness of first AlN film 10 is 480 nm, crystallinity maintains about the same level even if the annealing time is increased.

However, as shown by substrate numbers A1, A2, A3, B1, B2, B3, C1, and C2, if the thickness of first AlN film 10 is increased from 480 nm to 600 nm and 900 nm, crystallinity improves by increasing the annealing time.

Thus, crystallinity improves by increasing the annealing time as the thickness of first AlN film 10 is greater.

Similarly, as shown by substrate numbers A1, G1, and G2, if the thicknesses of AlN-containing films 100, 200, and 300 are greater, crystallinity improves by increasing the annealing time.

Further, substrate numbers B1, H1, and H4 also show similar tendency.

As described above, the thicknesses of AlN-containing film 100, AlN-containing film 200, and AlN-containing film 300 according to the present embodiment are in a range from 300 nm to 10000 nm. Thus, in the present embodiment, AlN-containing film 100, AlN-containing film 200, and AlN-containing film 300 can be given sufficiently great thicknesses, and thus nitride semiconductor substrates 11 and 21 according to the present embodiment have high crystallinity. Accordingly, high-quality nitride semiconductor substrates 11, 21, and 31 can be produced. Note that as shown in FIG. 8, nitride semiconductor substrates 11, 21, and 31 having still higher quality can be produced by being subjected to annealing processing at a sufficiently high annealing temperature and a sufficiently long annealing time.

As described above, as shown by substrate numbers B1, B2, B3, C1, and C2, crystallinity improves by increasing the annealing time (or stated differently, by performing the deposition process once and the annealing process multiple times).

Thus, nitride semiconductor substrate 11 manufactured by a manufacturing method which includes the preparation process, the deposition process, and the annealing process and in which at least one of the deposition process or the annealing process is performed multiple times has high crystallinity. Thus, crystallinity of high-quality nitride semiconductor substrate 11 can be achieved by using the manufacturing method according to the present embodiment.

Further, as shown by substrate numbers D1 and H1, the thickness of first AlN film 10 of substrate number D1 and a total thickness of first AlN film 10 and second AlN film 20 of substrate number H1 are 1200 nm and thus are the same, and furthermore, a total annealing time for substrate numbers D1 and H1 is 6 hours and thus is the same. However, the crystallinity of nitride semiconductor substrate 21 (substrate number H1) manufactured by the manufacturing method according to the second example is higher than the crystallinity of nitride semiconductor substrate 11 (substrate number D1) manufactured by the manufacturing method according to the first example.

Thus, crystallinity of nitride semiconductor substrate 21 can be further increased by using the manufacturing method according to the second example, which includes the preparation process, the deposition process, and the annealing process, and in which the deposition process and the annealing process are performed multiple times. Thus, high-quality nitride semiconductor substrate 21 can be produced by using the manufacturing method according to the present embodiment. In addition, cracks that are generated can be reduced effectively. In addition, a decrease in the flatness of the surface can be reduced effectively.

Note that substrate numbers D2 and H2 also show similar tendency.

As shown by substrate numbers F1, F2, F3, and F4, crystallinity improves by increasing the annealing temperature for first AlN film 10.

As illustrated in FIG. 8, XRC FWHMs of the (10-12) planes of AlN-containing film 100, AlN-containing film 200, and AlN-containing film 300 according to the present embodiment are at most 120 arcsec.

Thus, nitride semiconductor substrates 11, 21, and 31 according to the present embodiment have high crystallinity. Accordingly, high-quality nitride semiconductor substrates 11, 21, and 31 can be produced.

Furthermore, XRC FWHMs of the (0002) planes of AlN-containing film 100, AlN-containing film 200, and AlN-containing film 300 according to the present embodiment are at most 120 arcsec.

Thus, nitride semiconductor substrates 11, 21, and 31 according to the present embodiment have high crystallinity. Accordingly, high-quality nitride semiconductor substrates 11, 21, and 31 can be produced.

Substrate 2 according to the present embodiment consists essentially of sapphire, but the present embodiment is not limited thereto and may be a substrate consisting essentially of silicon carbide or ScAlMgO$_4$, for instance. Such materials of substrate 2 have high durability at high temperatures shown as examples in FIG. 8. Accordingly, AlN-containing film 100, AlN-containing film 200, and AlN-containing film 300 stacked above substrate 2 can be subjected to annealing processing at high temperatures. In this manner, as illustrated in FIG. 8, high-quality nitride semiconductor substrates 11, 21, and 31 can be produced.

As described above, first AlN film 10, second AlN film 20, and third AlN film 30 each consist essentially of one of AlN, $Al_xGa_yIn_{1-x-y}N$, or $B_zAl_wGa_{1-z-w}N$. In the present embodiment, first AlN film 10, second AlN film 20, and third AlN film 30 each consist essentially of AlN. In this manner, as illustrated in FIG. 8, high-quality nitride semiconductor substrates 11, 21, and 31 can be produced.

Here, images showing nitride semiconductor substrate 11 and nitride semiconductor substrate 21 according to the present embodiment observed using a scanning transmission electron microscope (STEM) are to be described.

Figure 9A:
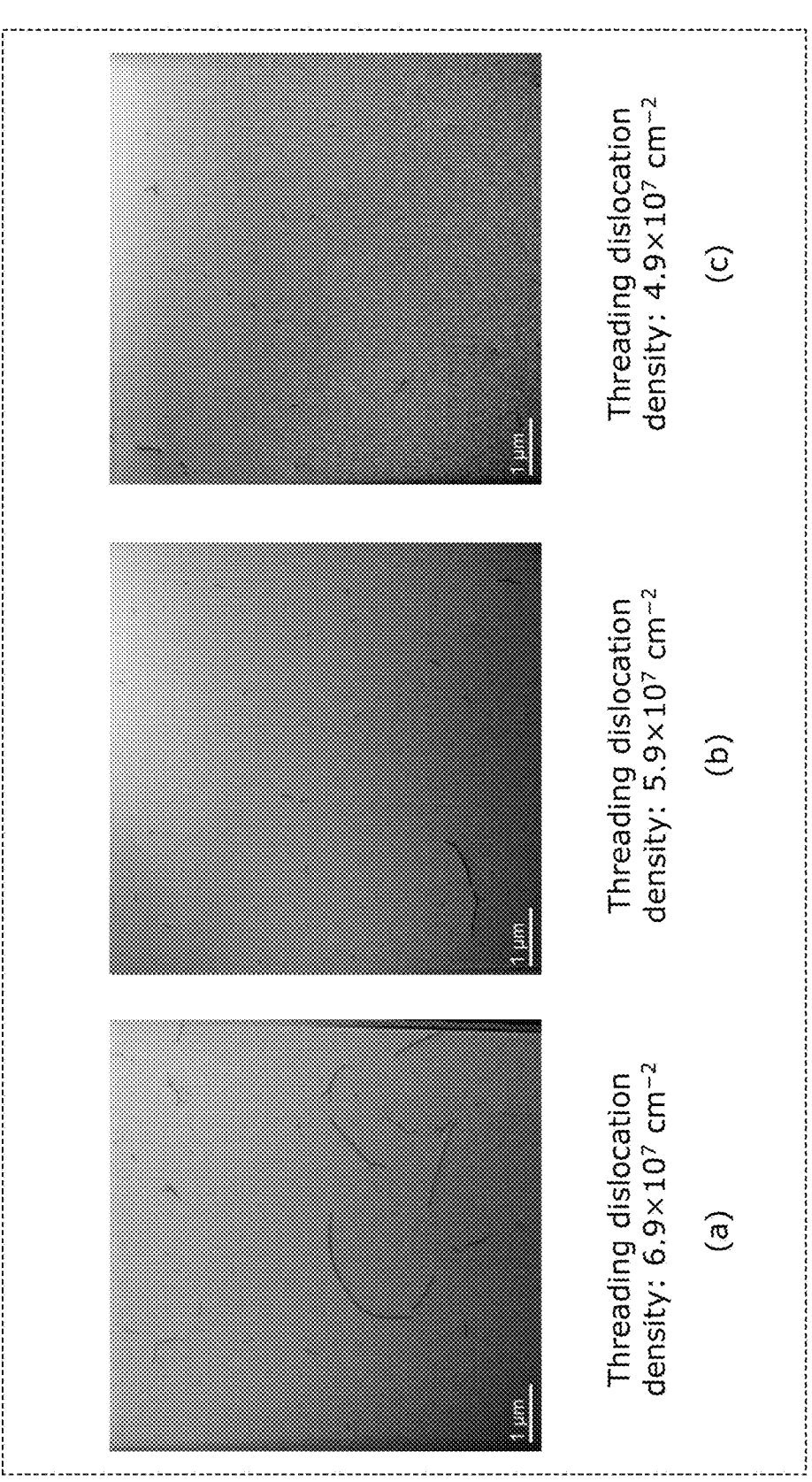
FIG. 9A illustrates planar transmission electron microscope (TEM) images showing the nitride semiconductor substrates according to the embodiment.

FIG. 9A illustrates planar STEM images showing nitride semiconductor substrate 11 (substrate number D2) and nitride semiconductor substrates 21 (substrate numbers H2 and H3) according to the present embodiment. Note that more specifically, (a) in FIG. 9A illustrates a planar STEM image of substrate number D2, (b) of FIG. 9A illustrates a planar STEM image of substrate number H2, and (c) of FIG. 9A illustrates a planar STEM image of substrate number H3.

The values also shown in FIG. 9A are threading dislocation densities of nitride semiconductor substrate 11 and nitride semiconductor substrates 21. A threading dislocation density is a value derived by counting the number of scotomas (corresponding to threading dislocations) that appear in an image and calculating the density of scotomas in a unit area.

FIG. 9B is another example drawing illustrating a table showing crystallinity of nitride semiconductor substrates 11 and 21 according to the present embodiment. Specifically, the crystallinity is shown by values obtained by calculating threading dislocation densities of nitride semiconductor substrate 11 (substrate number D2) and nitride semiconductor substrates 21 (substrate numbers H2 and H3) from the planar STEM images shown in FIG. 9A.

As illustrated in FIG. 9B, threading dislocation densities of AlN-containing film 100 of nitride semiconductor substrate 11 and AlN-containing films 200 of nitride semiconductor substrates 21 in the present embodiment are sufficiently lower than $2\times10^8$ $cm^{-2}$. More specifically, threading dislocation densities of AlN-containing film 100 and AlN-containing films 200 are at most $1.5\times10^8$ $cm^{-2}$, and more specifically, are at most $1\times10^8$ $cm^{-2}$.

Thus, nitride semiconductor substrates 11 and 21 according to the present embodiment each include substrate 2 and an AlN-containing film (AlN-containing film 100 or AlN-containing film 200) disposed above substrate 2. The thickness of the AlN-containing film is at most 10000 nm, and the threading dislocation density of the AlN-containing film is at most $2\times10^8$ $cm^{-2}$.

In this manner, nitride semiconductor substrates 11 and 21 according to the present embodiment are produced by using the manufacturing methods according to the present embodiment, and thus have sufficiently low threading dislocation densities and high crystallinity. Accordingly, high-quality nitride semiconductor substrates 11 and 21 can be produced.

Figure 9C:
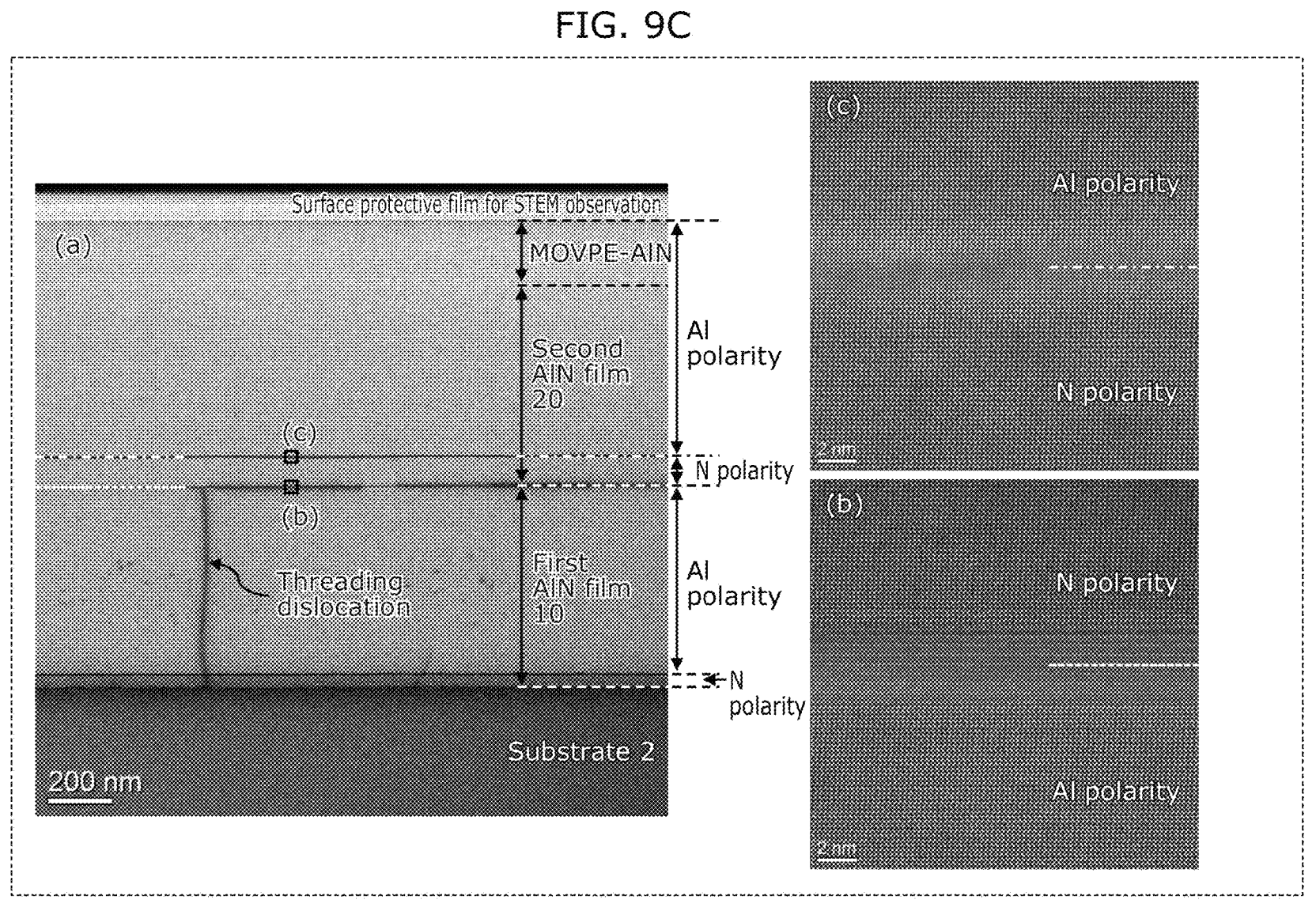

FIG. 9C illustrates cross-sectional STEM images of nitride semiconductor substrate 21 (substrate number H2) according to the present embodiment. For this analysis, an AlN film (stated as MOVPE-AlN in FIG. 9C) is formed by MOVPE in an upper portion of substrate number H2.

Part (a) of FIG. 9C illustrates a cross-sectional observation image that includes the interface between the sapphire substrate and first AlN film 10 up to the surface of the MOVPE-AlN. Parts (b) and (c) of FIG. 9C illustrate cross-sectional observation images of enlarged areas (b) and (c) shown in (a) of FIG. 9C.

As illustrated in FIG. 9C, nearly the entirety of first AlN film 10 and second AlN film 20 have an Al polarity. However, layers of AlN films having an N polarity are formed in a portion in first AlN film 10 in the vicinity of the interface between first AlN film 10 and substrate 2 and a portion in second AlN film 20 in the vicinity of the interface between second AlN film 20 and first AlN film 10. At this time, the thickness of the AlN films having the N polarity is at most 200 nm.

In the cross-sectional STEM image, two dark lines are observed at the interface between second AlN film 20 and first AlN film 10 and in a portion in second AlN film 20 in the vicinity of the interface between second AlN film 20 and first AlN film 10. A region defined by the two dark lines is an interface region. The polarity of the AlN film may be inverted at this interface region or the dark likes as a boundary, or an AlN film adjoining the interface region has the same Al polarity. Note that in the present embodiment, the interface region is a region having the N polarity in second AlN film 20 shown by FIG. 9C.

As shown by (a) of FIG. 9C, a threading dislocation that is generated at the interface between first AlN film 10 and substrate 2 and propagates through first AlN film 10 bends or ends at the interface region formed at the interface between second AlN film 20 and first AlN film 10, and thus does not reach second AlN film 20. Accordingly, it is assumed that there is a possibility that the interface region described above has functions of inhibiting propagation of a threading dislocation and reducing a density of threading dislocations that reach a top surface of nitride semiconductor substrate 21.

Next, a distribution of impurity concentrations of nitride semiconductor substrates 11 and 21 is to be described.

Figure 10:
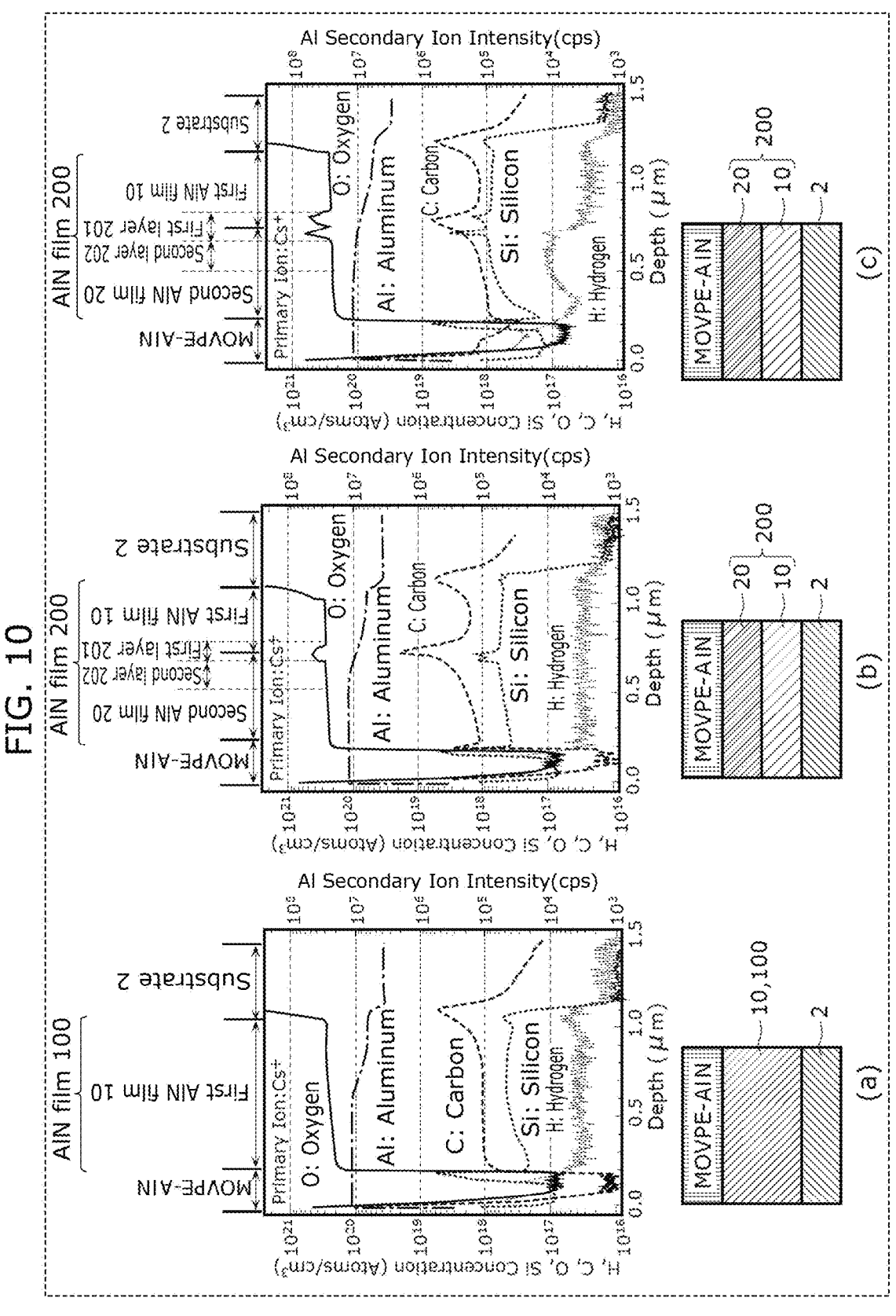
FIG. 10 illustrates results of analyzing impurity concentrations of the nitride semiconductor substrates according to the embodiment.

FIG. 10 illustrates results of analyzing impurity concentrations of nitride semiconductor substrates 11 and 21 according to the present embodiment.

Note that more specifically, (a) in FIG. 10 illustrate a result of substrate number D2, (b) of FIG. 10 illustrates a result of substrate number H2, and (c) of FIG. 10 illustrates a result of substrate number H3. In FIG. 10, impurity concentrations are analyzed by secondary ion mass spectrometry (SIMS). For this analysis, AlN films (stated as MOVPE-AlN in FIG. 10) are formed by MOVPE in upper portions of substrate numbers D2, H2, and H3.

Depth (μm) that is the horizontal axis indicating a distribution of impurity concentrations in FIG. 10 shows a distance in a direction from MOVPE-AlN toward substrate 2.

As described above, substrate number D2 denotes nitride semiconductor substrate 11 according to the first example, and substrate numbers H2 and H3 each denote nitride semiconductor substrate 21 according to the second example. Thus, in substrate number D2, AlN-containing film 100 is first AlN-containing film 10, and in substrate numbers H2 and H3, AlN-containing film 200 consists of first AlN-containing film 10 and second AlN-containing film 20.

As illustrated in FIG. 10, oxygen concentrations of AlN-containing film 100 and AlN-containing film 200 are in a range from $10^{18}$ $cm^{-3}$ to $10^{21}$ $cm^{-3}$. More specifically, the oxygen concentrations are in a range from $10^{19}$ $cm^{-3}$ to $10^{21}$ $cm^{-3}$, and more specifically, are in a range from $10^{20}$ $cm^{-3}$ to $10^{21}$ $cm^{-3}$. Further, hydrogen concentrations of AlN-containing film 100 and AlN-containing film 200 are in a range from $10^{16}$ $cm^{-3}$ to $2\times10^{17}$ $cm^{-3}$. More specifically, the hydrogen concentrations are in a range from $10^{16}$ $cm^{-3}$ to $10^{17}$ $cm^{-3}$.

Note that the oxygen concentrations and the hydrogen concentrations are not necessarily within the above concentration ranges over the entire regions of AlN-containing film 100 and AlN-containing film 200. For example, a region in which the oxygen concentration and the hydrogen concentration fall within the above concentration ranges may occupy at least a predetermined percentage of the entire region of each of AlN-containing film 100 and AlN-containing film 200. The predetermined percentage may be 30%, 50%, or 70%, for example. For example, the region in which the oxygen concentration and the hydrogen concentration fall within the above concentration ranges may be a predetermined region relative to the interface between substrate 2 and AlN-containing film 100 or 200. The predetermined region may be a region that spreads from a position apart from the interface by 100 nm to a position apart from the interface by 1000 nm.

AlN-containing film 200 includes first layer 201 and second layer 202 different from first layer 201.

Note that first layer 201 serves also as an interface layer. First layer 201 (interface layer) is a layer in which an element concentration has a peak. For example, first layer 201 (interface layer) is a layer in which the oxygen concentration, the carbon (C) concentration, and the silicon (Si) concentration have peaks. Note that first layer 201 (interface layer) is a layer in which at least one of the oxygen concentration, the carbon concentration, or the silicon (Si) concentration has a peak. As illustrated in FIG. 10, first layer 201 (interface layer) is located apart from substrate 2. Being located apart from substrate 2 means being located between (i) the interface between AlN-containing film 200 and substrate 2 and (ii) the surface of AlN-containing film 200 on the opposite side from substrate 2 (that is, the interface between AlN-containing film 200 and MOVPE-AlN in FIG. 10).

Second layer 202 is located in the vicinity of first layer 201 (interface layer).

First layer 201 occupies a region located at the interface between first AlN film 10 and second AlN film 20 as illustrated in FIG. 10, for example, and the thickness of first layer 201 is in a range from 10 nm to 200 nm.

Second layer 202 occupies a region located within second AlN film 20 as illustrated in FIG. 10, for example, but is not limited thereto as long as second layer 202 occupies a region different from first layer 201.

As illustrated in FIG. 10, element concentrations in first layer 201 are higher than element concentrations in second layer 202. For example, the oxygen concentration in first layer 201 is higher than the oxygen concentration in second layer 202. In other words, first layer 201 (interface layer) is a layer in which the oxygen concentration has a peak. Substrate numbers H2 and H3 that are nitride semiconductor substrates 21 according to the second example are exposed to the atmosphere during an interval between the first annealing processing and the second sputtering processing. The cause of the oxygen concentration in first layer 201 being higher than the oxygen concentration in second layer 202 is considered to be the exposure to the atmosphere, and due to this exposure to the atmosphere, first layer 201 has an oxygen concentration at its peak point (maximum point).

Thus, as shown by the present embodiment, a nitride semiconductor substrate that includes a region (first layer 201, for example) in which an element concentration is higher than that in a region in the vicinity thereof (second layer 202, for example) is estimated to be nitride semiconductor substrate 21 manufactured by the manufacturing method according to the second example.

The crystallinity of nitride semiconductor substrate 21 can be further increased by using the manufacturing method according to the second example, and thus if an element concentration in first layer 201 (for example, the oxygen concentration) is higher than the element concentration in second layer 202, this means that crystallinity of nitride semiconductor substrate 21 is high.

Note that the silicon concentration in first layer 201 is higher than the silicon concentration in second layer 202, and the carbon concentration in first layer 201 is higher than the carbon concentration in second layer 202, as illustrated in FIG. 10. Similarly to the above, the cause of the silicon or carbon concentration in first layer 201 being higher than the silicon or carbon concentration in second layer 202 is considered to be exposure to the atmosphere.

In the present embodiment, at least one of the oxygen concentration or the silicon concentration in first layer 201 is at least twice as high as the concentration(s) in second layer 202. This is expected to yield similar advantageous effects. Note that at least one of the oxygen concentration or the silicon concentration in first layer 201 may be at least 1.5 times higher than the concentration(s) in second layer 202, or may be at least 1.2 times higher than the concentration(s) in second layer 202.

As described above, in nitride semiconductor substrates 11 and 21 according to the present embodiment, threading dislocation densities of AlN-containing films (AlN-containing film 100 and AlN-containing film 200) are at most $2 \times 10^8$ cm$^{-2}$, and XRC FWHMs of the (10-12) planes of those AlN-containing films are at most 120 arcsec. The XRC FWHMs of the (10-12) planes of the AlN-containing films in substrate numbers H2 and H3 are at most 90 arcsec, and those in substrate number H2 are at most 80 arcsec. Furthermore, as illustrated in FIG. 10, the oxygen concentrations in the AlN-containing films are in a range from $10^{18}$ cm$^{-3}$ to $10^{21}$ cm$^{-3}$, and the hydrogen concentrations therein are in a range from $10^{16}$ cm$^{-3}$ to $2 \times 10^{17}$ cm$^{-3}$.

As described above, this shows that nitride semiconductor substrates 11 and 21 according to the present embodiment in which the oxygen concentrations and the hydrogen concentrations in the AlN-containing films are within the above ranges have sufficiently low threading dislocation densities, sufficiently low XRC FWHMs, and high crystallinity. Accordingly, high-quality nitride semiconductor substrates 11 and 21 can be produced.

Further, nitride semiconductor substrates 11 and 21 according to the present embodiment each include substrate 2 and an AlN-containing film (AlN-containing film 100 or AlN-containing film 200) disposed above substrate 2. The thicknesses of the AlN-containing films are in a range from 300 nm to 10000 nm. Furthermore, as illustrated in FIG. 10, the oxygen concentrations in the AlN-containing films are in a range from $10^{18}$ cm$^{-3}$ to $10^{21}$ cm$^{-3}$, and the hydrogen concentrations therein are in a range from $10^{16}$ cm$^{-3}$ to $2 \times 10^{17}$ cm$^{-3}$.

As described above, by adopting the manufacturing methods according to the present embodiment, the AlN-containing films in nitride semiconductor substrates 11 and 21 according to the present embodiment are sufficiently thick as substrates of semiconductor elements, and high-quality nitride semiconductor substrates 11 and 21 having high crystallinity can be produced.

In the present embodiment, thicknesses of AlN-containing films 100, 200, and 300 are preferably at most 2000 nm. As illustrated in FIG. 8, AlN-containing films 100, 200, and 300 each having such a thickness have high crystallinity. Accordingly, high-quality nitride semiconductor substrates 11, 21, and 31 can be produced.

[Evaluation 2 of Nitride Semiconductor Substrate]

Furthermore, here, results of evaluating crystallinity of AlN-containing film 100 included in nitride semiconductor substrate 11 manufactured while changing manufacturing conditions of the manufacturing method according to the second example of the present embodiment are to be described. In addition, a redundant description same as the description of "Evaluation 1 of nitride semiconductor substrate" may be omitted or simplified in "Evaluation 2 of nitride semiconductor substrate".

Note that as compared with nitride semiconductor substrates 11, 21, and 31 described in "Evaluation 1 of nitride semiconductor substrate", nitride semiconductor substrate 11 described in "Evaluation 2 of nitride semiconductor substrate" mainly has two features as follows. Specifically, one of the two features is that second annealing processing is performed without depositing second AlN film 20 by second sputtering processing. The other of the two features is that substrate 2 on which first AlN film 10 (that is, AlN-containing film 100) is deposited is not exposed to the atmosphere and held at a predetermined temperature (T$_{mid}$ later described) in chamber 110 or the annealing device, during a period between the first annealing processing and the second annealing processing.

First, the effect of controlling the temperature of substrate 2 on which first AlN film 10 is deposited during a period between the first annealing processing and the second annealing processing is to be described, with reference to FIG. 11 and FIG.

FIG. 11 is another example drawing illustrating a table showing crystallinity of nitride semiconductor substrate 11 according to the present embodiment. Note that more specifically, FIG. 11 illustrates results of measuring nitride semiconductor substrate 11 by an XRD. In addition, FIG. 13 and FIG. 15 also illustrate results of measurement by the XRD, similarly.

The crystallinity of AlN-containing film 100 correlates with values of full widths at half maximum at diffraction peaks obtained by XRC measurement on the (0002) plane and the (10-12) plane. The smaller an XRC FWHM is, that is, the sharper an obtained diffraction peak is, the better crystallinity is. Note that the unit of an XRC FWHM is arcsec (") indicating an angle. The same also applies to FIG. 13 and FIG. 15 described later.

The sample substrates to which the substrate numbers shown in FIG. 11 are given each correspond to nitride semiconductor substrate 11 manufactured by the manufacturing method according to the present embodiment. The same also applies to FIG. 13 and FIG. 15 described later.

In the following, sample substrates having the substrate numbers are denoted by their substrate numbers such as substrate number 51, in "Evaluation 2 of nitride semiconductor substrate".

Figure 12:
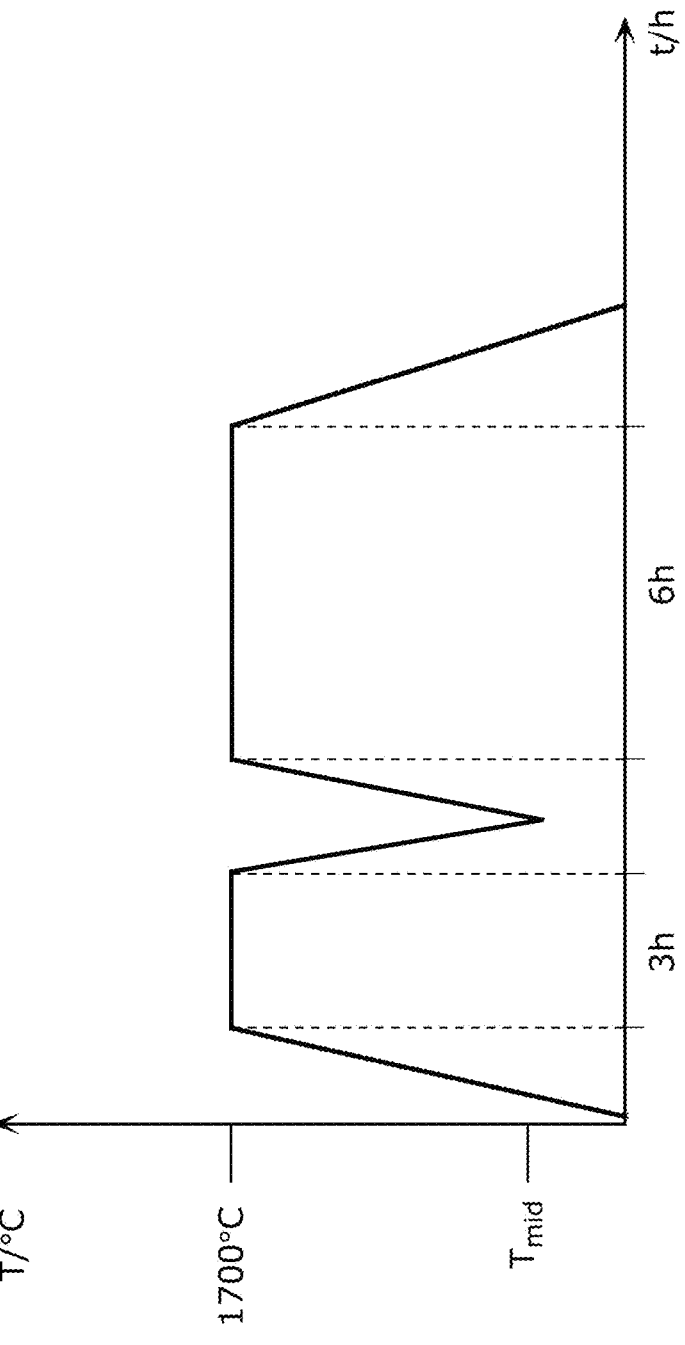
FIG. 12 is an example of a schematic diagram showing a change in temperature in a manufacturing method according to the second example.

FIG. 12 is an example of a schematic diagram showing a change in temperature in the manufacturing method according to the second example. More specifically, FIG. 12 illustrates a change in temperature in the manufacturing method according to the second example for manufacturing nitride semiconductor substrates 11 (substrate numbers 51 to 55) illustrated in FIG. 11. Note that in FIG. 12, the horizontal axis indicates a processing time, and the vertical axis indicates a processing temperature. Also in FIG. 14 and FIG. 16 described later, the horizontal axis indicates a processing time, and the vertical axis indicates a processing temperature, similarly.

With reference to FIG. 12, a change in temperature in the annealing processes (first annealing processing (fourth process S34) and second annealing processing (sixth process S36)) in the manufacturing method according to the second example, which is the method for manufacturing substrate numbers 51 to 55, is to be described.

In the manufacturing method according to the second example that is the method for manufacturing substrate numbers 51 to 55, substrate 2 on which first AlN film 10 is deposited is annealed at 1700° C. for three hours in the first annealing process (fourth process S34), as illustrated in FIG. 12. Furthermore, the temperature of substrate 2 on which first AlN film 10 is deposited is decreased down to T$_{mid}$.

As described above, second AlN film 20 is not deposited in the second sputtering processing.

Next, as illustrated in FIG. 12, substrate 2 on which first AlN film 10 is deposited is annealed at 1700° C. for six hours in the second annealing process (sixth process S36). Furthermore, substrate 2 on which first AlN film 10 is deposited is taken out of the annealing device. Accordingly, substrate numbers 51 to 55 are manufactured.

Thus, in the manufacturing method according to the second example illustrated in FIG. 12, substrate 2 on which first AlN film 10 is deposited is not exposed to the atmosphere and is held in chamber 110 or an annealing device at T$_{mid}$ that is a predetermined temperature, during a period between the first annealing processing and the second annealing processing.

As illustrated in FIG. 11, first AlN films 10 in substrate numbers 51 to 55 each have a thickness of 784 nm or 793 nm, and thus the thicknesses are substantially the same. Substrate numbers 51 to 55 are manufactured using the same manufacturing method, except that the predetermined temperature (T$_{mid}$) during a period between the first annealing processing and the second annealing processing is different.

As illustrated in FIG. 11, the value of T$_{mid}$ is smaller in the order of substrate numbers 51, 52, 53, 54, and 55. Furthermore, as illustrated in FIG. 11, an XRC FWHM of the (10-12) plane tends to be smaller in the order of substrate numbers 51, 52, 53, 54, and 55, and thus crystallinity improves in this order.

From the above, if the predetermined temperature (T$_{mid}$) is lower during a period when annealing processing is temporarily stopped between the first annealing processing and the second annealing processing, crystallinity of first AlN film 10 (that is, AlN-containing film 100) is higher, so that high-quality nitride semiconductor substrate 11 can be produced. Specifically, in FIG. 11, a more preferable XRC FWHM is achieved when the value of T$_{mid}$ is 400° C. and 150° C. (that is, substrate numbers 54 and 55). A time for maintaining at the predetermined temperature (T$_{mid}$) is selected from a range from about 0 seconds to about 120 minutes. In this manner, distortion based on thermal expansion coefficients of sapphire and AlN moves a threading dislocation, by decreasing a temperature during a period when annealing processing is temporarily stopped in the annealing processing. Moving a threading dislocation is effective in decreasing the threading dislocation density.

Furthermore, the effect produced by a total processing time of the first annealing processing and the second annealing processing is to be described with reference to FIG. 13 and FIG. 14.

FIG. 13 is another example drawing illustrating a table showing crystallinity of nitride semiconductor substrate 11 according to the present embodiment.

Figure 14:
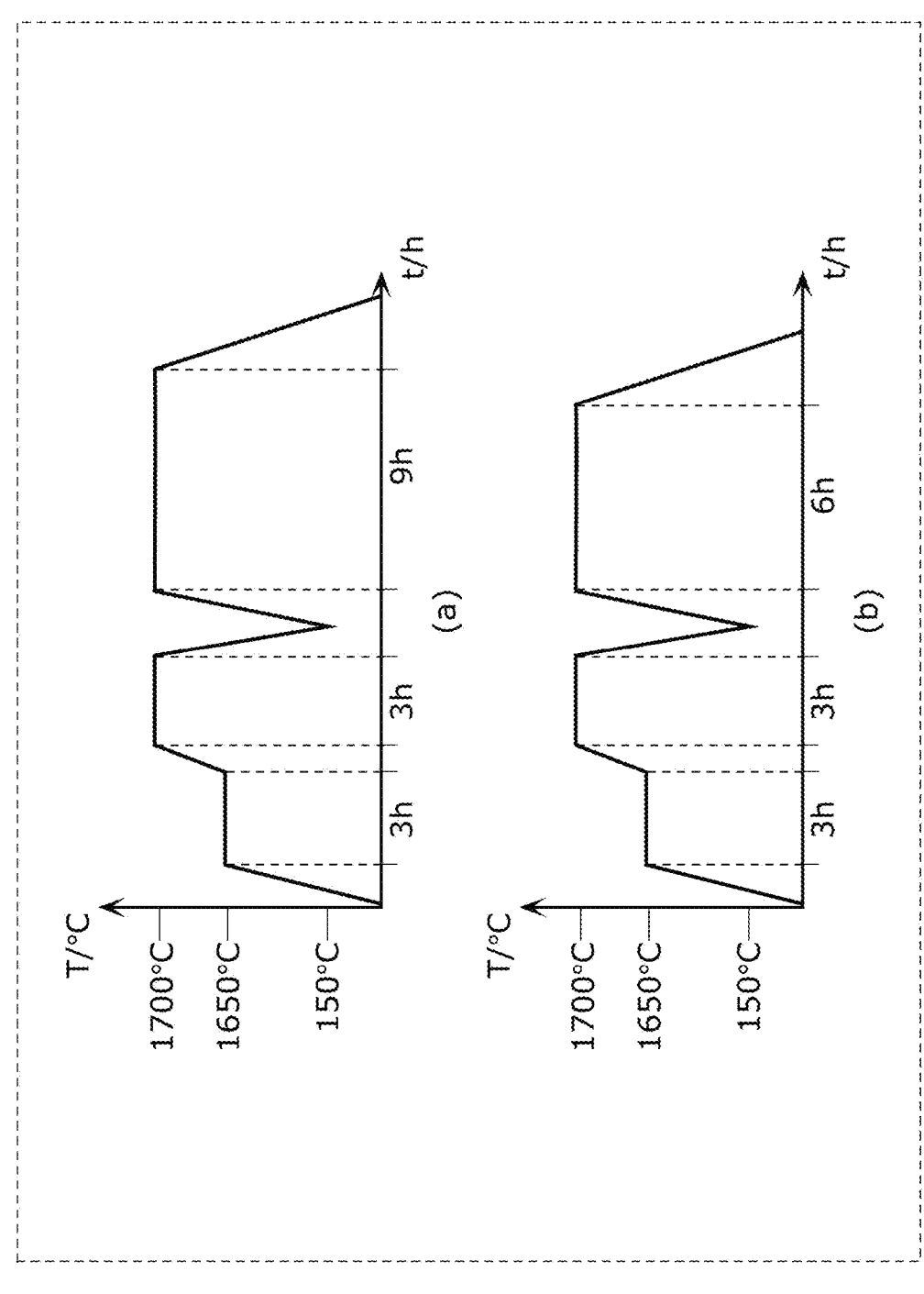
FIG. 14 is another example of a schematic diagram showing changes in temperature in the manufacturing method according to the second example.

FIG. 14 is another example of a schematic diagram showing changes in temperature in the manufacturing method according to the second example. More specifically, (a) of FIG. 14 illustrates a change in temperature in the manufacturing method according to the second example for manufacturing nitride semiconductor substrate 11 (substrate number 56) illustrated in FIG. 13, whereas (b) of FIG. 14 illustrates a change in temperature in the manufacturing method according to the second example for manufacturing nitride semiconductor substrate 11 (substrate number 57) illustrated in FIG. 13.

With reference to FIG. 14, a change in temperature in the annealing processes (first annealing processing (fourth process S34) and second annealing processing (sixth process S36)) in the manufacturing method according to the second example that is a method for manufacturing substrate numbers 56 and 57 is to be described.

In the manufacturing method according to the second example that is the method for manufacturing substrate numbers 56 and 57, substrate 2 on which first AlN film 10 is deposited is annealed at 1650° C. for three hours and thereafter annealed at 1700° C. for three hours in the first annealing process (fourth process S34), as illustrated in FIG. 14. Furthermore, the temperature of substrate 2 on which first AlN film 10 is deposited is decreased down to 150° C.

In the manufacturing method according to the second example in [Evaluation 2 of nitride semiconductor substrate], second AlN film 20 is not deposited in the second sputtering processing (fifth process S35) in FIG. 6.

Next, as illustrated in FIG. 14, substrate 2 on which first AlN film 10 is deposited is annealed at 1700° C. for a predetermined time in the second annealing process (sixth process S36). Furthermore, substrate 2 on which first AlN film 10 is deposited is taken out of the annealing device. Accordingly, substrate numbers 56 and 57 are manufactured.

As illustrated in FIG. 13, first AlN films 10 in substrate numbers 56 and 57 each have a thickness of 784 nm or 793 nm, and thus the thicknesses are substantially the same. Substrate numbers 56 and 57 are manufactured using the same manufacturing method except that the annealing time in the second annealing processing is different.

As illustrated in FIG. 14, the annealing times in the second annealing processing on substrate numbers 56 and 57 are 9 hours and 6 hours, respectively. Thus, as illustrated in FIG. 13, the annealing times at 1700° C. on substrate numbers 56 and 57 are 12 hours and 9 hours, respectively. Furthermore, as illustrated in FIG. 13, an XRC FWHM of the (10-12) plane tends to be greater in the order of substrate numbers 56 and 57. Thus, substrate number 56 for which the annealing time is longer at 1700° C. has better crystallinity than substrate number 57.

Furthermore, the effect produced by the flow rate of a nitrogen gas in the first sputtering processing is to be described with reference to FIG. 15 and FIG. 16.

FIG. 15 is another example drawing illustrating a table showing crystallinity of nitride semiconductor substrates 11 according to the present embodiment.

The manufacturing method according to the second example for manufacturing substrate numbers 58 to 60 illustrated in FIG. 15 is to be described.

First, the first sputtering processing for depositing first AlN film 10 is to be described. Note that "N$_2$ Flow (sccm) During SP" shown in FIG. 15 indicates the flow rate of a nitrogen gas in the first sputtering processing.

In the manufacturing method according to the second example for manufacturing substrate numbers 58 to 60, the flow rate of a nitrogen gas in the first sputtering processing differs for each of substrate numbers 58 to 60. For substrate number 58, the flow rate is constant during the period for the first sputtering processing, and is 24 sccm. For substrate numbers 59 and 60, the flow rate is controlled so that the rate increases during the period for the first sputtering processing. More specifically, for substrate number 59, the flow rate increases from 19 sccm to 28 sccm by control, and for substrate number 60, the flow rate increases from 19 sccm to 32 sccm by control.

Next, the annealing processes (the first anneal processing (fourth process S34) and the second annealing processing (sixth process S36)) are to be described with reference to FIG. 16. FIG. 16 is another example of a schematic diagram showing a change in temperature in the manufacturing method according to the second example. More specifically, FIG. 16 illustrates a change in temperature in the manufacturing method according to the second example for manufacturing nitride semiconductor substrates 11 (substrate numbers 58 to 60) illustrated in FIG. 15.

Substrate 2 on which first AlN film 10 is deposited is annealed at 1650° C. for 3 hours, and thereafter annealed at 1700° C. for 3 hours in the first annealing process (fourth process S34). Furthermore, the temperature of substrate 2 on which first AlN film 10 is deposited is decreased down to 150° C.

As described above, second AlN film 20 is not deposited in the second sputtering processing.

Figure 16:
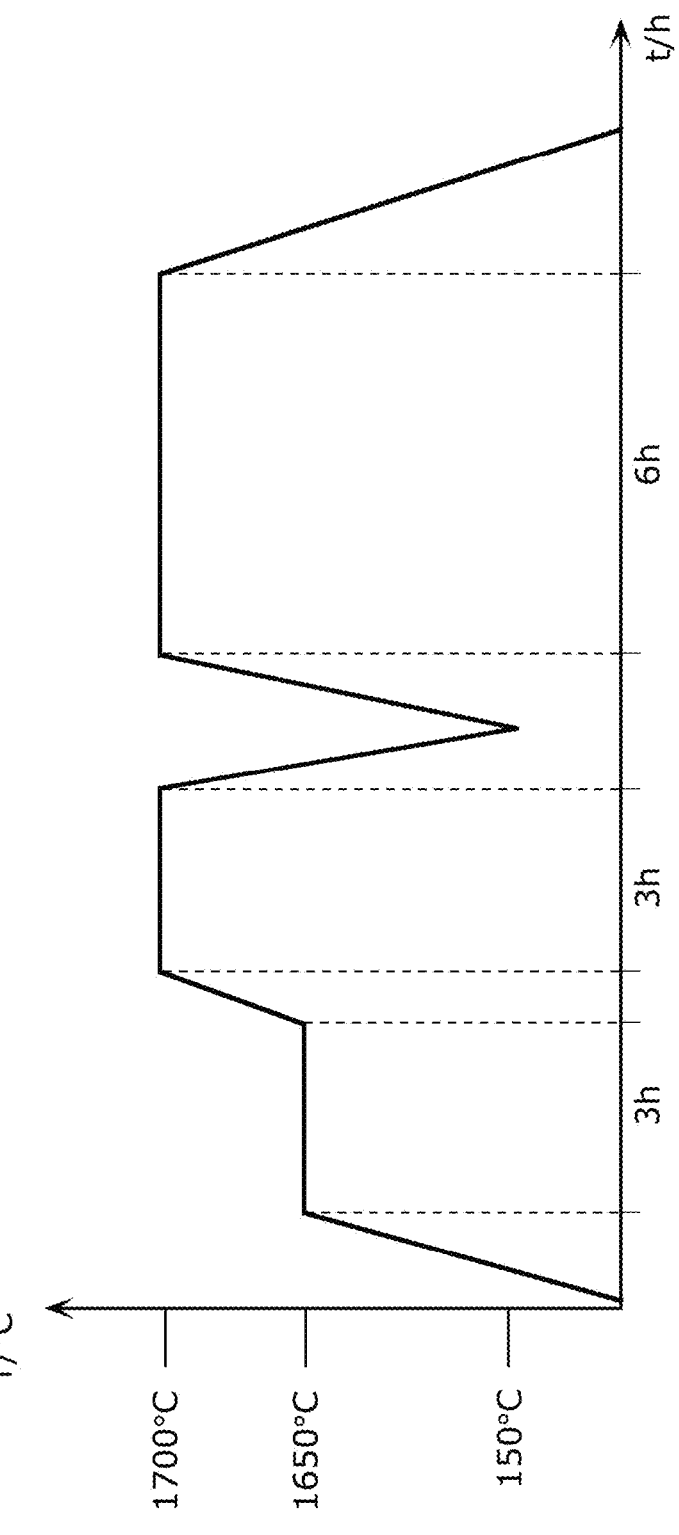
FIG. 16 is another example of a schematic diagram showing a change in temperature in the manufacturing method according to the second example.

Next, as illustrated in FIG. 16, substrate 2 on which first AlN film 10 is deposited is annealed at 1700° C. for six hours in the second annealing process (sixth process S36). Furthermore, substrate 2 on which first AlN film 10 is deposited is taken out of the annealing device. In this manner, substrate numbers 58 to 60 are manufactured.

As illustrated in FIG. 15, first AlN films 10 in substrate numbers 58 to 60 each have a thickness of 778 nm, 791 nm, or 798 nm, and thus the thicknesses are substantially the same. Substrate numbers 58 to 60 are manufactured using the same manufacturing method, except that the flow rate described above differs for the substrates.

As illustrated in FIG. 15, as compared with substrate number 58, XRC FWHMs of the (10-12) planes of substrate numbers 59 and 60 tend to be smaller, so that the crystallinity improves due to an increase in the above flow rate. Furthermore, as compared with substrate number 59, an XRC FWHM of the (10-12) plane of substrate number 60 is smaller, so that the crystallinity improves due to an increase in the above flow rate to a value greater than 24 sccm.

Figure 17:
FIG. 17 illustrates other examples of results of analyzing impurity concentrations of the nitride semiconductor substrate according to the embodiment.

FIG. 17 illustrates other examples of results of analyzing impurity concentrations of nitride semiconductor substrate 11 according to the present embodiment. More specifically, (a) of FIG. 17 illustrates results of analyzing impurity concentrations of nitride semiconductor substrate 11 before the first annealing processing is performed, whereas (b) of FIG. 17 illustrates results thereof after the first annealing processing is performed.

Note that nitride semiconductor substrate 11 used in FIG. 17 has the same configuration as that of substrate number Al described above, except that first AlN film 10 (AlN-containing film 100) has a thickness of 320 nm, the annealing temperature in the first annealing processing is 1700° C., and the annealing time is 3 hours.

As illustrated in (a) and (b) of FIG. 17, impurity concentrations vary by performing the first annealing processing. In particular, the hydrogen concentration remarkably changes as compared with the concentrations of the other elements. The hydrogen concentration of first AlN film 10 (AlN-containing film 100) falls in a range from $10^{16}$ cm$^{-3}$ to $2\times10^{17}$ cm$^{-3}$ by performing the first annealing processing. As illustrated in (b) of FIG. 17, a region in which the hydrogen concentration of first AlN film 10 (AlN-containing film 100) is in the above range occupies a predetermined percentage (here, 50%, for example) of the entire region of AlN-containing film 100. The oxygen concentration of first AlN film 10 (AlN-containing film 100) is in a range from $10^{18}$ cm$^{-3}$ to $10^{21}$ cm$^{-3}$.

Nitride semiconductor substrate 11 used in FIG. 17 includes substrate 2, and AlN-containing film 100 provided above substrate 2. The thickness of AlN-containing film 100 is in a range from 300 nm to 10000 nm. Furthermore, as illustrated in FIG. 17, the oxygen concentration of AlN-containing film 100 is in a range from $10^{18}$ cm$^{-3}$ to $10^{21}$ cm$^{-3}$, and the hydrogen concentration thereof is in a range from $10^{16}$ cm$^{-3}$ to $2\times10^{17}$ cm$^{-3}$.

As described above, by adopting the manufacturing method according to the present embodiment, AlN-containing film 100 in nitride semiconductor substrate 11 is sufficiently thick as a substrate of a semiconductor element, and high-quality nitride semiconductor substrate 11 having high crystallinity can be produced.

[Evaluation 3 of Nitride Semiconductor Substrate]

Furthermore, here, results of evaluating crystallinity of AlN-containing film 100 included in nitride semiconductor substrate 11 manufactured while changing manufacturing conditions of the manufacturing method according to the first example of the present embodiment are to be described. In addition, a redundant description same as the description of "Evaluation 1 of nitride semiconductor substrate" may be omitted or simplified in "Evaluation 3 of nitride semiconductor substrate".

In [Evaluation 3 of nitride semiconductor substrate], nitride semiconductor substrate 11 having the same configuration as that of substrate number A1 is evaluated, mainly except two points as below. Specifically, the two points are that the thickness of first AlN film 10 (AlN-containing film 100) is 100, 200, 300, 400, 500, 600, 700, 1000, or 1100 nm, and the annealing temperature is 1700° C. and the annealing time is 1, 3, 6, 9, or 12 hours in the first annealing processing.

Figure 18:
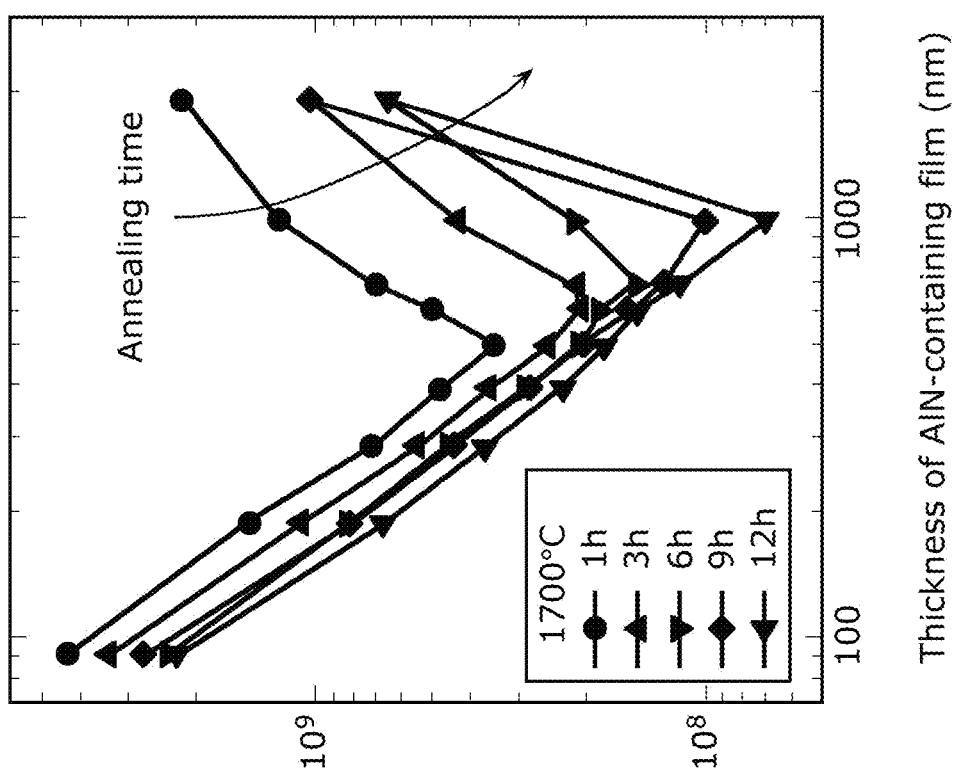
FIG. 18 illustrates a relation among the thickness of, the annealing time for, and the threading dislocation density of an AlN-containing film according to the embodiment.

FIG. 18 illustrates a relation among the thickness of, the annealing time for, and the threading dislocation density of AlN-containing film 100 according to the present embodiment. As illustrated in FIG. 18, here, substrates 2 on each of which AlN-containing film 100 having a thickness of 100, 200, 300, 400, 500, 600, 700, 1000, or 1100 nm is deposited are each annealed for 1, 3, 6, 9, or 12 hours, thus manufacturing plural nitride semiconductor substrates 11.

The threading dislocation densities of plural nitride semiconductor substrates 11 are calculated. Note that the threading dislocation densities are calculated from XRC FWHMs of the (0002) planes and the (10-12) planes.

The longer the annealing time is, the lower the threading dislocation density is. Furthermore, the greater the thickness of AlN-containing film 100 is, the lower the threading dislocation density is. However, as illustrated in FIG. 18, if the thickness of AlN-containing film 100 exceeds a predetermined thickness, the threading dislocation density is higher. Thus, if the thickness of AlN-containing film 100 exceeds the upper limit, the threading dislocation density deteriorates. This is due to an increase in the XRC FWHM of the (0002) plane, that is, an increase in fluctuation in the c-axis direction of crystal grains, if the thickness of AlN-containing film 100 increases.

Further, as can be seen from FIG. 18, when the thickness of AlN-containing film 100 is at most 2000 nm, more specifically, at most 1500 nm, or yet more specifically, at most 1000 nm, the threading dislocation density can be sufficiently lowered, and crystallinity of nitride semiconductor substrate 11 according to the present embodiment can be increased. Accordingly, high-quality nitride semiconductor substrate 11 can be produced. What can be understood from FIG. 18 is that the threading dislocation density can be decreased down to $2 \times 10^8$ cm$^{-2}$ or lower, if the thickness of AlN-containing film 100 is in a range from 500 nm to 1500 nm.

[Semiconductor Element]

Furthermore, here, semiconductor elements that include nitride semiconductor substrates 11, 21, and 31 according to the present embodiment are to be described. A semiconductor element may be, for instance, a high electron mobility transistor (HEMT), but is an ultraviolet light emitting element, here. In particular, the semiconductor element can be used as a light emitting diode (LED) for deep ultraviolet light having a wavelength in a range from 200 nm to 280 nm.

A configuration of ultraviolet light emitting element 400 according to the present embodiment is to be described with reference to FIG. 19.

Figure 19:
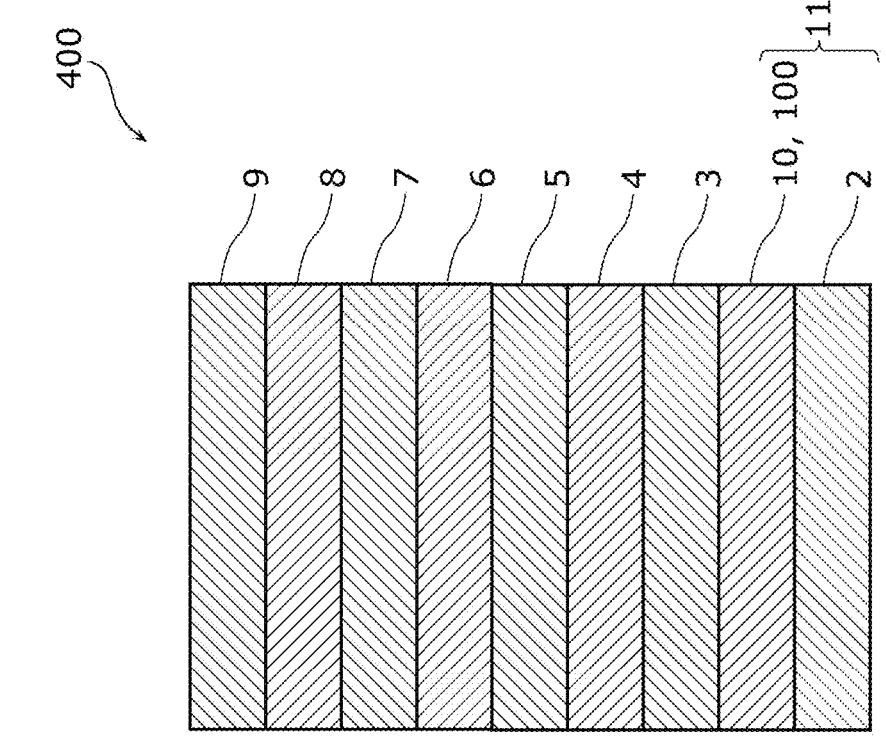
FIG. 19 is a schematic diagram illustrating a stack structure of an ultraviolet light emitting element according to the embodiment.

FIG. 19 is a schematic diagram illustrating a stack structure of ultraviolet light emitting element 400 according to the present embodiment.

Ultraviolet light emitting element 400 includes, as an example, nitride semiconductor substrate 11, flattening layer 3, buffer layer 4, electron injection layer 5, light emission layer 6, electron block layer 7, hole-injection layer 8, and electrode contact layer 9, which are formed in order.

AlN is used for flattening layer 3, but the present embodiment is not limited thereto. For example, flattening layer 3 may consist essentially of AlN, AlGaN, or AlGaInN. Flattening layer 3 is used to flatten the surface of nitride semiconductor substrate 11. Furthermore, flattening layer 3 also plays a role in adjusting a lattice constant.

AlGaN is used for buffer layer 4, but the present embodiment is not limited thereto. Similarly to flattening layer 3, for example, buffer layer 4 may consist essentially of AlN, AlGaN, or AlGaInN. Buffer layer 4 functions as a layer to adjust a lattice constant, similarly to flattening layer 3.

Further, n-AlGaN is used for electron injection layer 5, but the present embodiment is not limited thereto. Similarly to flattening layer 3 and buffer layer 4, for example, electron injection layer 5 may consist essentially of AlN, AlGaN, or AlGaInN. Furthermore, electron injection layer 5 is desirably an n-type semiconductor, for the purpose of exhibiting the function of injecting electrons.

Electron injection layer 5 may also carry out a function of transporting electrons. In order that electron injection layer 5 functions as an n-type semiconductor, Si (silicon), Ge (germanium), Sn (tin), O (oxygen), S (sulfur), Se (selenium), or Te (tellurium) can be used for electron injection layer 5, but Si is used therefor in the present embodiment.

A multiple quantum well (MQW) layer formed of plural AlGaN layers having different Al compositions is used as light emission layer 6. A MQW is a multiple quantum well structure in which quantum wells are stacked.

Electrons and holes are injected to light emission layer 6 from electron injection layer 5 and hole-injection layer 8. Electrons and holes are recombined in light emission layer 6, and light emission layer 6 emits light. Thus, light emission layer 6 can emit light having a shorter wavelength as a band gap that is a difference in energy between the conduction band and the valence band of light emission layer 6 is greater.

A composition ratio of Al and Ga in AlGaN can be controlled, and thus an arbitrary band gap in a range from 3.4 eV (GaN) to 6.0 eV (AlN), which are the band gaps of the elements. This region is a region for emitting ultraviolet light, and thus AlGaN is suitable as a light emitting material of a device that emits ultraviolet light.

AlN is used for electron block layer 7, but the present embodiment is not limited thereto. Similarly to flattening layer 3, buffer layer 4, and electron injection layer 5, for example, electron block layer 7 may consist essentially of AlN, AlGaN, or AlGaInN. Electron block layer 7 is used to inhibit electrons injected from electron injection layer 5 from leaking from light emission layer 6 to hole-injection layer 8. Accordingly, electron block layer 7 effectively functions by being made of a material having a greater band gap than that of light emission layer 6.

Electron block layer 7 may have a structure in which plural materials having different band gaps are stacked. Electron block layer 7 may have a structure in which a band gap continuously changes in the stack direction within electron block layer 7. Electron block layer 7 may be doped with an element other than Al, Ga, In, or N as an impurity, in order to make the layer into a p-type semiconductor.

For hole-injection layer 8, p-AlGaN is used, but the present embodiment is not limited thereto. Similarly to flattening layer 3, buffer layer 4, electron injection layer 5, and electron injection layer 7, for example, hole-injection layer 8 may consist essentially of AlN, AlGaN, or AlGaInN. Hole injection layer 8 has a function of injecting holes to a light emission layer, and may also have a function of transporting holes. In order to make hole-injection layer 8 into a p-type semiconductor, Mg (magnesium), Be (beryllium), C (carbon), and Zn (zinc) can be used, yet Mg is used in the present embodiment.

For electrode contact layer 9, p-AlGaN that includes a greater amount of doping material than hole-injection layer 8 is used, yet the present embodiment is not limited thereto. Similarly to flattening layer 3, buffer layer 4, electron injection layer 5, electron block layer 7, and hole-injection layer 8, electrode contact layer 9 may consist essentially of AlN, AlGaN, or AlGaInN, for example. Electrode contact layer 9 is connected to an electrode for supplying holes.

As described above, nitride semiconductor substrate 11 according to the present embodiment has high crystallinity, and thus the semiconductor element according to the present embodiment exhibits high performance. For example, when the semiconductor element is ultraviolet light emitting element 400, a deterioration of light emission characteristics due to threading dislocations in nitride semiconductor substrate 11, and thus ultraviolet light emitting element 400 has high efficiency of light emission. Note that similar advantageous effects can be yielded also when nitride semiconductor substrates 21 and 31 are used.

In this manner, since a semiconductor element includes nitride semiconductor substrate 11, 21, or 31 according to the present embodiment, a high-quality semiconductor element can be produced.

[Others]

The above has described the nitride semiconductor substrates, for instance, according to the embodiments, yet the present invention is not limited to the above embodiments.

For example, AlN-containing film 100, AlN-containing film 200, and AlN-containing film 300 are deposited by sputtering technique in the embodiments, yet the present invention is not limited thereto. For example, MOVPE technique, hydride vapor phase epitaxy (HVPE) technique, and molecular beam epitaxy (MBE) technique may be used.

The present invention may also encompass embodiments as a result of applying, to the embodiments, various modifications that may be conceived by those skilled in the art, and embodiments obtained by combining elements and functions in the embodiments in any manner without departing from the spirit of the present venation.

INDUSTRIAL APPLICABILITY

The present invention can be used as a high-quality nitride semiconductor substrate and as a light semiconductor element such as an ultraviolet light emitting element.

REFERENCE SIGNS LIST

2 substrate
3 flattening layer
4 buffer layer
5 electron injection layer
6 light emission layer
7 electron block layer
8 hole-injection layer
9 electrode contact layer
10 first AlN film
11, 21, 31 nitride semiconductor substrate
20 second AlN film
30 third AlN film
100, 200, 300 AlN-containing film
101 inlet pipe

102 exhaust pipe
103 valve
104 exhaust pump
105 substrate holder
107 target
108 permanent magnet
109 high voltage power supply
110 chamber
400 ultraviolet light emitting element
1000 sputtering device
S21, S31, S41 first process
S22, S32, S42 second process
S23, S33, S43 third process
S24, S34, S44 fourth process
S35, S45 fifth process
S36, S46 sixth process
S47 seventh process
S48 eighth process

The invention claimed is:

1. A nitride semiconductor substrate comprising:
a substrate; and
an AlN-containing film provided above the substrate,
wherein a thickness of the AlN-containing film is at most 10000 nm,
a threading dislocation density of the AlN-containing film is at most $1.5 \times 10^8$ cm$^{-2}$,
a full width at half maximum of an X-ray diffraction rocking curve of a (10-12) plane of the AlN-containing film is at most 120 arcsec,
the substrate comprises one of sapphire, silicon carbide, or ScAlMgO$_4$, and
the AlN-containing film comprises:
a first AlN film provided above the substrate; and
a second AlN film provided above the first AlN film;
wherein a thickness of the first AlN film is at least 100 nm and at most 900 nm,
a thickness of the second AlN film is at least 100 nm and at most 900 nm, and
the second AlN film comprises Al$_x$Ga$_y$In$_{1-x-y}$N, wherein $0.5 \leq x \leq 1$, $0 \leq y \leq 0.5$, and $x+y \leq 1$.

2. The nitride semiconductor substrate according to claim 1,
wherein an oxygen concentration of the AlN-containing film is in a range from $10^{18}$ cm$^{-3}$ to $10^{21}$ cm$^{-3}$, and
a hydrogen concentration of the AlN-containing film is in a range from $10^{16}$ cm$^{-3}$ to $2 \times 10^{17}$ cm$^{-3}$.

3. The nitride semiconductor substrate according to claim 1,
wherein the threading dislocation density is at most $1.0 \times 10^8$ cm$^{-2}$.

4. The nitride semiconductor substrate according to claim 1,
wherein the AlN-containing film includes at least one interface layer that is located apart from the substrate, the at least one interface layer being a layer in which an element concentration has a peak.

5. The nitride semiconductor substrate according to claim 4,
wherein a thickness of the at least one interface layer is in a range from 10 nm to 200 nm, and
the at least one interface layer has at least one of an oxygen concentration or a silicon concentration that is at least twice an oxygen concentration or a silicon concentration of a layer located in a vicinity of the at least one interface layer.

6. The nitride semiconductor substrate according to claim 1, wherein the AlN-containing film further comprises one of AlN, $Al_xGa_yIn_{1-x-y}N$, or $B_zAl_wGa_{1-z-w}N$, where $0.5 \leq x \leq 1$, $0 \leq y \leq 0.5$, $x+y \leq 1$, $0 \leq z \leq 0.5$, $0.5 \leq w \leq 1$, and $z+w \leq 1$.

7. The nitride semiconductor substrate according to claim 1, wherein the thickness of the AlN-containing film is at most 2000 nm.

8. A semiconductor element comprising:

the nitride semiconductor substrate according to claim 1.

\* \* \* \* \*